(12) United States Patent
Hekmatpour

(10) Patent No.: US 6,584,455 B1
(45) Date of Patent: Jun. 24, 2003

(54) SYSTEM AND METHOD FOR PREDICTING DESIGN ERRORS IN INTEGRATED CIRCUITS

(75) Inventor: Amir Hekmatpour, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/460,829

(22) Filed: Dec. 14, 1999

Related U.S. Application Data

(62) Division of application No. 09/460,844, filed on Dec. 14, 1999, and a division of application No. 09/460,843, filed on Dec. 14, 1999.

(51) Int. Cl.[7] .................................................. G06N 5/00
(52) U.S. Cl. .............................. 706/45; 706/46; 706/52
(58) Field of Search .............................. 706/45, 46, 52

(56) References Cited

PUBLICATIONS

Brandt, Y.; Jervis, B.W.; Maidon, Y.; Circuit multi–fault diagnosis and prediction error estimation using a committee of Bayesian neural networks, Testing Mixed Signal Circuits and Systems (Ref. No.: 1997/361), IEE Colloquium on, Oct. 23, 1997, pp. 7/1.*

Wegener, C.; Kennedy, M.P.; Incorporation of hard–fault–coverage in model–based testing of mixed–signal Ics, Design, Automation and Test in Europe Conference and Exhibition 2000. Proceedings, Mar. 27, 2000, pp.: 765.*

Cuviello, M.; Dey, S.; Xiaoliang Bai; Yi Zhao; Fault modeling and simulation for crosstalk in system–on–chip interconnects, Computer–Aided Design, 1999. Digest of Technical Papers. 1999 IEEE/ACM International Conference on, Nov. 7, 1999, pp.: 297.*

Mao–Feng Lan; Geiger, R.; Impact of model errors on predicting performance of matching–critical circuits, Circuits and Systems, 2000. Proceedings of the 43rd IEEE Midwest Symposium on, vol.: 3, Aug. 8, 2000, pp.: 1324–1328 vol. 3.*

* cited by examiner

Primary Examiner—Wilbert L. Starks, Jr.
(74) Attorney, Agent, or Firm—Thomas E. Tyson; Edmond A. DeFrank

(57) ABSTRACT

The present invention is embodied in a system and method for predicting design errors, such as errors in integrated circuit design. The system and method of the present invention use a probabilistic model, such as a Bayesian Belief Network (BBN), to predict design errors at any point in the design process by using information about the current design in combination with historical design error data from previous designs. Prediction of design errors is based on a probabilistic comparison of conditions or error symptoms in the current design, to similar or identical conditions or error symptoms associated with design errors identified in prior designs. In addition, the system and method of the present invention is capable of rolling forward in a design from the point where conditions or error symptoms are predicted to analyze the effect such conditions or symptoms may have on the overall design functionality and performance, and whether such conditions and symptoms are actually caused by or will produce design errors. In other words, the system and method of the present invention predicts known errors that have a probabilistic chance of occurring under known conditions and during known tasks, new errors with a probabilistic chance of occurring due to new conditions during a known task, and new errors that have a probabilistic chance of occurring due to new errors that have already happened or have already been predicted.

29 Claims, 12 Drawing Sheets

SYSTEM AND METHOD FOR PREDICTING DESIGN ERRORS IN INTEGRATED CIRCUITS

CROSS REFERENCE TO RELATED APPLICATIONS

This application is a divisional of U.S. patent application Ser. No. 09/460,844, filed on Dec. 14, 1999 by Hekmatpour, and entitled A SYSTEM AND METHOD FOR DETECTING DESIGN ERRORS IN INTEGRATED CIRCUITS, and U.S. patent application Ser. No. 09/460,843, filed on Dec. 14, 1999 by Hekmatpour, and entitled A SYSTEM AND METHOD FOR RECOVERING FROM DESIGN ERRORS IN INTEGRATED CIRCUITS.

BACKGROUND OF THE INVENTION

1. Field of the Invention

The present invention relates to a system and method for identifying design errors in integrated circuits, and in particular to a system and method for using a trainable probabilistic model to predict, detect, and recover from design errors in an integrated circuit design and verification process. This invention relates specifically to design error prediction, while the related divisional patent applications referenced above relate to design error detection and design error recovery, respectively.

2. Related Art

Integrated circuits are becoming increasingly complex as the sizes of transistors and circuit traces continue to decrease, thereby allowing the construction of greater numbers of transistors and logic elements in smaller and smaller packages. As the complexity of integrated circuits, such as, for example, microprocessors, microcontrollers, analog-to-digital converters, and digital signal processors, has increased, the time typically allotted from initial design to final production has steadily decreased due to factors such as market demand, competition, and semiconductor manufacturing improvements.

Consequently, the design of sub-components of integrated circuits are often completed in parallel by multiple teams of designers using a variety of design tools. As a result, it is possible for design errors to be introduced into an integrated circuit that may go undetected until late in the design process, or possibly not even until after release of a production circuit. Further, the cost of corrective action in addressing design errors typically increases dramatically as circuit design nears completion, and may be most expensive following completion of design and production.

The problem of integrated circuit design error detection has been addressed in several ways. For example, one technique uses a probability network to analyze circuit performance after completion of circuit design to detect manufacturing errors in emitter and base resistors in a VLSI circuit. However, this technique does not apply to other stages or steps of the VLSI circuit design. Further, other types of logic errors are not addressed by this technique.

In another approach, a fault-simulation based technique is used to identify erroneous signals in a VLSI circuit by that can be corrected by re-synthesis of the erroneous signals. The fault-simulation of this technique generates erroneous vectors by random simulation. The erroneous vectors are binary or three valued input vectors that can be used to differentiate between a signal as implemented in a VLSI circuit, and the signal as specified in the circuit design. The correcting power of a particular signal is measured in terms of the signal s correctable set, namely, the maximum set of erroneous input vectors that can be corrected by re-synthesizing the signal. Only the signals that can correct every erroneous input vector are considered as a potential error source. This technique deals with circuit level signal errors, and not design errors, or errors introduced by design tools or methods of design.

In a similar approach, a fault-simulation based technique is used to identify erroneous signals in a sequential VLSI circuit by that can be corrected by re-synthesis of the erroneous signals. This technique locates an erroneous signal in a specific class of logic design errors, and provides a methodology to test whether an incorrect signal can be fixed by re-synthesizing the signal. In other words, this technique provides a method for correcting an erroneous output of a circuit without addressing the root cause of the error. However, re-synthesis of an erroneous signal requires the addition of additional transistors and logic elements to a particular portion of an integrated circuit that is affected by the erroneous signal. Consequently, while re-synthesis of an erroneous signal may fix a specific problem in a circuit, such a fix may introduce other design errors as well as timing and power problems elsewhere in the circuit as a result of the additional transistors and logic elements.

Another technique uses behavioral simulation models to analyze the dependability of a logic circuit early in the design of the circuit. This technique requires that a circuit design be abstracted into a number of discrete levels. The technique then uses the discrete levels to create a behavioral simulation model for performing circuit functional verification, circuit performance evaluation, and circuit dependability analysis. However, because this technique uses a single model, circuit design errors not covered by the model go undetected. Further, where error symptoms are found, there is no mechanism for backtracking to the source of the errors. Finally, this technique is applicable only at early stages of the design.

Still another technique uses a diagnostic algorithm based on backward-propagation techniques to localize design errors in combinational logic circuits. This technique addresses single logic gate replacement and insertion errors. In other words, this technique assumes the existence of a single gate error as the root cause of an error in a logic circuit.

Therefore, what is needed is a system and method for reliably detecting integrated circuit design errors as early in the design process as possible while being capable of detecting errors at any point in the design process. Further, such a system should be capable of detecting multiple types of design errors. The system should be capable of backtracking to the source of an error when error symptoms are detected. The system should also suggest corrective action to address the root cause of the problem as opposed to patching errors to correct deficient or erroneous signals. This invention relates specifically to design error prediction, while the related divisional patent applications referenced above relate to design error detection and design error recovery, respectively.

SUMMARY OF THE INVENTION

To overcome the limitations in the related art described above, and to overcome other limitations that will become apparent upon reading and understanding the present application, the present invention is embodied in a system and method for predicting, detecting and recovering from design errors in integrated circuits such as, for example, microprocessors, microcontrollers, analog-to-digital converters, and digital signal processors. For purposes of this description, design errors include errors, such as, for example, errors introduced by improper or incorrect use of design tools, errors introduced by data conversion problems, errors introduced by misinterpretation of design specifications, errors introduced as a result of design methodology, and errors introduced as a result of incorrect or improper logic circuit design or simulation. The system and method of the present invention uses inferential reasoning with a probabilistic model, such as a Bayesian Belief Network (BBN), to predict, detect and recover from design errors at any point in the design process by using information about the current design in combination with historical design data and design error data from previous integrated circuit designs in classes of integrated circuits that are the same or similar as the current design. BBN s are belief based probabilistic models that are typically represented as Directed Acyclic Graphs (DAG) in which nodes represent variables, arcs signify the existence of direct causal influence between the linked variables, and the strengths of these influences are expressed by forward conditional probabilities.

Prediction, detection, and recovery from design errors are preferably based on a probabilistic comparison of conditions or error symptoms, predicted or detected in the current design, to similar or identical conditions or error symptoms associated with design errors identified in prior designs. In addition, the system and method of the present invention are capable of backtracking or rolling back through the design to the source of an error when conditions or error symptoms are predicted or detected, and of rolling forward in a design from the point where conditions or error symptoms are predicted or detected to analyze the effect such conditions or symptoms may have on the overall design functionality and performance, and to determine whether such conditions and symptoms are actually caused by or will produce design errors. The system and method of the present invention also preferably alerts users and suggests corrective action such as, for example, adjusting design attributes, repeating design steps, or suggesting workarounds to be applied to current or future design steps, to address the root cause of predicted and detected design errors in order to recover from those errors.

Identification of design errors as early in the design process as possible is important in order to minimize the cost of redesign. The cost of integrated circuit redesign typically increases as the design nears completion. Consequently, a dynamic probabilistic dependency model having a plurality of conditionally related variables, such as, for example a BBN, is used to predict, detect and recover from design errors. The probabilistic model is preferably displayed both textually and graphically on a computer display device, such that a user may have an immediate visual indication of the present state of the design. In addition, the present invention preferably provides the user with the capability to query the model, input new data into the model, and refine the model by editing or updating data, attributes of the design, probabilities associated with attributes, and confidence factors of the model.

Specifically, the present invention uses inferential reasoning in combination with a dynamic probabilistic model, such as a BBN, to predict, detect, and recover from design errors. The design process is preferably partitioned into a set of tasks, tools, and outputs. Tasks are defined as design efforts by one or more integrated circuit designers using one or more tools to design or develop specific functional units within an overall design. Tools are defined as computer programs or methods used to design or develop specific functional units within an overall design. Outputs at each stage of the design are the final results produced by a combination of tasks and tools at each stage. Design errors are typically introduced into a design by tasks, tools, and integrated circuit designers who utilize, initialize, adjust and interpret various software and hardware tools.

Conditions such as predicted or observed system behavior are analyzed using a probabilistic model, such as a BBN. These conditions are introduced into the design by tasks, tools and integrated circuit designers, and can appear, and be observed, measured, or controlled at any stage of the design. Conditions can create symptoms, which once identified, are preferably traced to design errors. While symptoms are directly related to at least one design error, they may or may not be directly observable or measurable. Consequently, the existence of symptoms is preferably inferred using conditional probabilities generated by the probabilistic model, then traced back to the specific design error or conditions causing the symptoms, again using inferential reasoning in combination with the conditional probabilities generated by the probabilistic model.

Prediction of design errors before observation or measurement of such errors is extremely valuable in that it allows integrated circuit designers to address design errors as early in the design process as possible. Error prediction in accordance with the present invention preferably analyzes a plurality of design environment data, such as, for example, seemingly negligible deviation and warning messages, and infers probabilistic relationships between the design environment data and design error classes, objects, and error templates. The conditions and symptoms associated with a design error in an existing design are input into the probabilistic model of the present invention to predict the probability of the same or similar design errors in a new design. In other words, a probabilistic knowledge-base of historical design errors in a given design environment is used to simulate and infer the existence or probability of occurrence of the same or similar design errors in a new design, at a specific stage or level of that design, before the design is complete. The results of the probabilistic prediction of design errors are preferably presented to the user both textually and graphically in an interactive computer program environment, having elements such as, for example, voice activated input or control, touch screen activated input or control, or input or control activated via a keyboard or pointing device.

Detection of design errors in evolving or completed designs is accomplished by the present invention by monitoring conditions, or patterns of conditions produced by design tasks that have historically been associated with symptoms related to design errors in previous designs. The probabilistic model of the present invention uses fuzzy inferencing to identify and rank condition sets of the present design against historical conditions and condition sets from prior designs. Consequently, where an exact match between present and historical conditions or condition sets is not identified, the inexact pattern matching afforded by inferential analysis of the conditional probabilities generated by the probabilistic model of the present invention is utilized to identify the probability that the same or similar design error exists in the present design as were identified in the prior design. The results of the probabilistic detection of design errors are preferably presented to the user both textually and graphically in an interactive computer program environment.

Recovery from design errors is typically a time consuming and expensive process. However, it has been observed that the same or similar classes of design errors tend to recur often, especially in families, of logic circuits, such as, for example, a microprocessor design that evolves over a period of months or years, and is typically produced and released in incrementally expanded versions. Consequently, the probabilistic model of the present invention provides guidance in addressing and resolving design errors. Specifically, once conditions leading to the symptoms associated with design errors are predicted or detected, a case is generated. An inference engine then uses the conditional probabilities produced by the probabilistic model of the present invention to compile a set of exact or similar cases from a historical knowledge base containing solutions and known fixes to previously identified design errors, based on their probability of matching the case of the current design. These probabilistic cases are then presented to the user, ranked with their likelihood or probability of match to the current predicted or detected design error. These cases are preferably presented to the user both textually and graphically in an interactive computer program environment.

The foregoing and still further features and advantages of the present invention as well as a more complete understanding thereof will be made apparent from a study of the following detailed description of the invention in connection with the accompanying drawings and appended claims.

BRIEF DESCRIPTION OF THE DRAWINGS

Referring now to the drawings in which like reference numbers represent corresponding parts throughout.

DETAILED DESCRIPTION OF THE INVENTION

Figure 1:
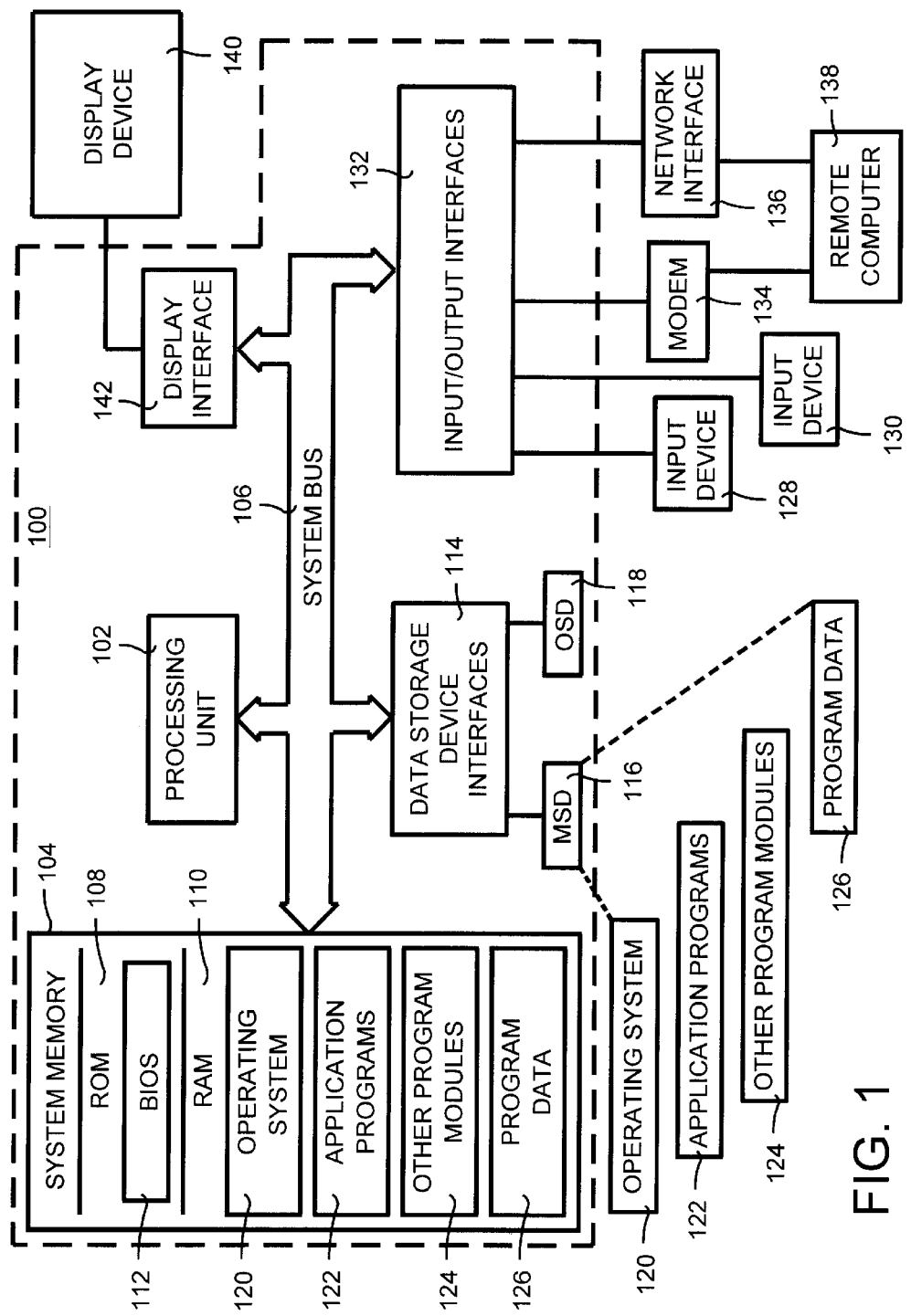
FIG. 1 is a block diagram illustrating an apparatus for carrying out the invention.

In the following description of the invention, reference is made to the accompanying drawings, which form a part hereof, and in which is shown by way of illustration a specific example in which the invention may be practiced. It is to be understood that other embodiments may be utilized and structural changes may be made without departing from the scope of the present invention.

Introduction

The present invention is embodied in a system and method for predicting, detecting and recovering from design errors in integrated circuits, such as, for example, microprocessors, microcontrollers, analog-to-digital converters, and digital signal processors. For purposes of this description, design errors include errors, such as, for example, errors introduced by improper or incorrect use of design tools, errors introduced by data conversion problems, errors introduced by misinterpretation of design specifications, errors introduced as a result of design methodology, and errors introduced as a result of incorrect or improper logic circuit design or simulation. The system and method of the present invention uses inferential reasoning in combination with a probabilistic model, such as a Bayesian Belief Network (BBN), to predict, detect and recover from design errors in integrated circuits at any point in the design process by using information about the current design in combination with historical design error data from previous designs. BBN s are belief based probabilistic models that are typically represented as Directed Acyclic Graphs (DAG) in which nodes represent variables, arcs signify the existence of direct causal influence between the linked variables, and the strengths of these influences are expressed by forward conditional probabilities.

The design of an integrated circuit is often an evolutionary process, with the same set of tools, such as computer aided design (CAD) software programs, and methodologies being used in the design of several versions of an integrated circuit. Further, classes or families of integrated circuits, such as, for example, increasingly powerful microprocessors based upon a common architecture, also typically use the same set of tools and methodologies during design. As a result, the same or similar problems and design errors tend to recur in designs that are based on, or in some way similar to, prior designs. As design errors are identified and addressed either during or after a typical design process, errata sheets and the like are typically produced describing these design errors, and the solutions used to address the errors. Consequently, large amounts of data exist which describe prior design errors. The probabilistic model of the present invention uses this data of prior design errors to predict, detect, and recover from the same or similar errors in new designs.

Consequently, prediction and detection of design errors, and recovery from design errors is based on a probabilistic comparison of conditions or error symptoms, predicted or detected in a current design, to similar or identical conditions or error symptoms associated with design errors identified in prior designs. In addition, the system and method of the present invention is capable of backtracking or rolling back through the design to the source of an error when conditions or error symptoms are predicted or detected, and of rolling forward in a design from the point where conditions or error symptoms are predicted or detected to analyze the effect such conditions or symptoms may have on overall design performance or functionality, and to determine whether such conditions and symptoms are actually caused by or are likely to produce design errors. The system and method of the present invention also preferably alerts users to the predicted or detected occurrence of design errors, and suggests corrective action to address the root cause of those errors in order to recover from the errors.

Exemplary Operating Environment

The following discussion, in combination with FIG. 1 is intended to provide a brief, general description of an exemplary computing environment in which the present invention may be implemented. Although not required, the invention will be described in the general context of computer-executable instructions being executed by a computer. Generally, such computer executable instructions include procedures, functions, routines, programs, objects, components, data structures, etc. that perform particular tasks or implement particular abstract data types. Such computer-executable instructions are commonly referred to as program modules. Moreover, those skilled in the art will appreciate that the invention may be practiced with a variety of computer system configurations, including personal computers, server computers, handheld devices, multiprocessor systems, microprocessor-based or programmable consumer electronics, network PCs, minicomputers, mainframe computers, and the like. The invention may also be practiced in distributed computing environments where tasks are performed by remote processing devices that are linked through a communications network. In a distributed computing environment, computer executable instructions implementing a program for carrying out the present invention may be located on both local and remote computer storage media including memory storage devices.

Referring to FIG. 1, an exemplary system for implementing the invention includes a general purpose computing device in the form of a conventional computer 100. Such a computer typically includes a central processing unit 102 (commonly known as a CPU), a system memory 104, and a system bus 106 that couples various system components including the system memory to the CPU. The system bus 106 may be any of several types of bus structures. The system memory 104 typically includes computer storage media in the form of read only memory (ROM) 108 and random access memory (RAM) 110. A basic input/output system (BIOS) 112, containing the basic routines that helps to transfer information between elements within the computer 100 is also stored in ROM 108.

The computer 100 typically includes at least one data storage device interface 114 coupled to the system bus 106 for reading or writing data to or from permanent or removable data storage devices, such as, for example, a magnetic storage device 116, such as a hard disk drive, a floppy disk drive, or a flash memory card, or an optical storage device 118, such as a CD-ROM, or DVD-ROM drive. The storage devices and their associated computer-readable media provide storage of computer readable instructions, data structures, program modules and other data for the computer 100. Although the exemplary environment described herein employs magnetic 116 and optical 118 storage devices, it should be appreciated by those skilled in the art that other types of computer readable media can store data that is accessible by a computer. Such computer readable media can be any available media that can be accessed by the computer 100.

By way of example, and not limitation, such computer readable media may comprise communication media and computer storage media. Communication media typically embodies computer readable instructions, data structures, program modules or other data in a modulated data signal such as a carrier wave or other transport mechanism and includes any information delivery media. The term modulated data signal means a signal that has one or more of its characteristics set or changed in such a manner as to encode information in the signal. By way of example, and not limitation, communication media includes wired media such as wired network or direct wired connection, and wireless media such as acoustic, RF, infrared microwave, and other wireless media. Computer storage media includes any method or technology for the storage of information such as computer readable instructions, data structures, program modules or other data. By way of example, such storage media includes RAM, ROM, EPROM, flash memory or other memory technology, CD, DVD, or other optical disk storage, magnetic cassettes, magnetic tape, magnetic disk storage or other magnetic storage devices, or any other medium that can be used to store the desired information and which can be accessed by the computer 100. Combinations of any of the above are also included within the scope of computer readable media.

A number of program modules may be stored on the data storage devices 116 or 118, including an operating system 120, one or more application programs 122, other program modules 124, and program data 126. Further, during operation of the computer 100, these program modules, 120, 122, 124, and 126 are also typically stored temporarily in RAM 110 to improve overall system performance. A user may enter commands and information into the computer 100 through input devices 128 and 130 such as, for example, a keyboard, pointing device, microphone, joystick, game pad, satellite dish, scanner, or the like. These and other input devices are often connected to the processing unit 102 through at least one input/output interface 132, coupled to the system bus 106. Input/output interfaces typically include interfaces such as, for example, a serial port, a parallel port, a game port, or a universal serial bus (USB).

Further, the computer 100 may operate in a networked environment using a modem 134, or a network interface 136 to establish logical connections to one or more remote computers, such as a remote computer 138. The remote computer 138 may be a personal computer, a server, a router, a network PC, a peer device or other common network node, and typically includes many or all of the elements described above relative to the computer 100. The logical connections described above include connections such as, for example, a local area network (LAN) or a wide area network (WAN). Such networking environments are commonplace in offices, enterprise-wide computer networks, intranets and the Internet.

When used in a LAN environment, the computer 100 is connected to the local network through the network interface 136. When used in a WAN environment, the computer 100 typically uses the modem 134 or other means for establishing communications over the WAN, such as the Internet. The modem 134, which may be internal or external, is connected to the system bus 106 via one of the input/output interfaces 132. In a networked environment, program modules depicted relative to the computer 100, or portions thereof, may be stored in the remote memory storage device. It will be appreciated that the network connections shown are exemplary and other means of establishing a communications link between the computers may be used.

A display device 140 is also typically connected to the system bus 106 via a display interface 142. In addition to the display device, computers also typically include other peripheral output devices (not shown), such as, for example, speakers and printers.

System Overview

The present invention uses a dynamic inference engine to perform inferential reasoning using conditional probabilities produced by a probabilistic model, such as a BBN, to predict, detect, and recover from design errors. The design process may be partitioned into a set of tasks, tools, and outputs. Tasks are defined as design efforts by one or more integrated circuit designers or designers using one or more tools to design or develop specific functional units within an overall design. Tools are defined as computer programs or methods used to design or develop specific functional units within an overall integrated circuit design. Outputs at each stage of the design are the final results produced by a combination of tasks and tools at each stage. Design errors are typically introduced into a design by tasks and tools.

Conditions such as predicted or observed system behavior are analyzed using an inference engine and the probabilistic model, such as a BBN. These conditions are typically introduced into the design by tasks and tools. Conditions can create symptoms, which once identified, are traced to design errors. While symptoms are directly related to at least one design error, they may or may not be directly observable or measurable. Consequently, the existence of symptoms is preferably inferred by the inference engine, based upon an analysis of the conditional probabilities generated by the probabilistic model, then traced back to the specific design error or errors causing the symptoms, again using the inference engine in combination with the probabilistic model.

Operation

Figure 2:
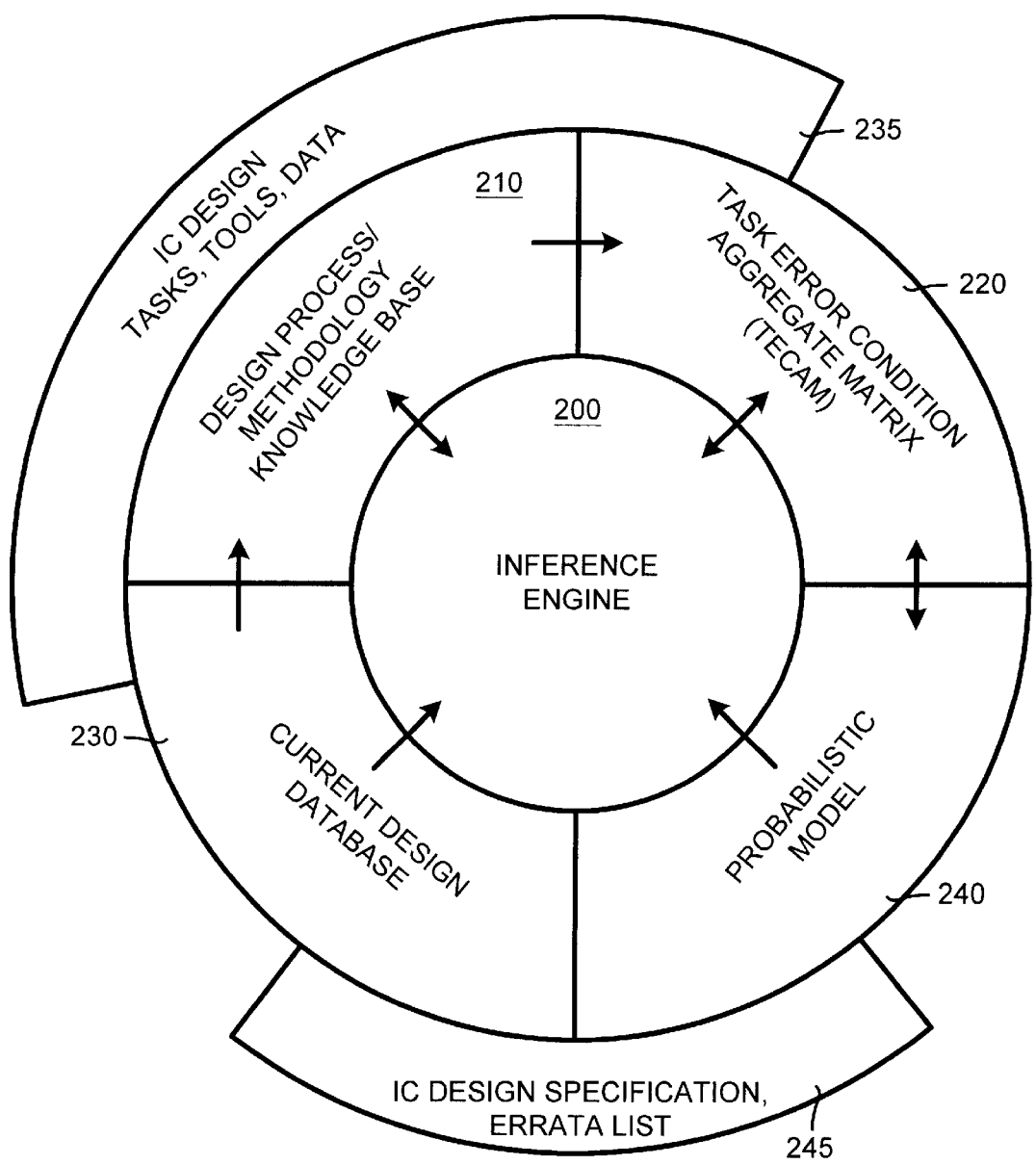
FIG. 2 is a general architectural diagram illustrating an overview of exemplary interrelationships between processes of the present invention.

FIG. 2 is a general architectural diagram illustrating an overview of exemplary interrelationships between processes of the present invention. In general, an inference engine 200 uses inexact, or probabilistic inferential reasoning to infer plausible design errors in the design of an integrated circuit, such as, for example microprocessors, microcontrollers, analog-to-digital converters, and digital signal processors. The inference engine 200 preferably interfaces with a historical design knowledge base 210 of prior design errors and design conditions, and a task error condition aggregate matrix (TECAM) 220 which is preferably an aggregate of tasks, conditions and design errors as defined above to form a dynamic data-structure representing design tasks, design-space state conditions, condition density, and error density. The TECAM matrix 220 is preferably derived using information detailing the current design as provided by a current design attributes database 230 in conjunction with the historical design knowledge base 210. In addition, information 235 relating to or derived from integrated circuit design tasks, tools, data, or integrated circuit designers is preferably integrated into the historical design knowledge base 210, the TECAM matrix 220, and the current design attributes database 230.

The TECAM matrix 220 is preferably represented graphically so that the user may view the current state of the design, and interact with the TECAM matrix using a computing device, such as the computer or computer network environments described above, to obtain detailed information on specific tasks, conditions, or errors. The TECAM matrix 220 is preferably used to dynamically populate and update a dynamic probabilistic model 240, such as a BBN. In addition, information 245 relating to or derived from integrated circuit design specifications and errata lists is preferably integrated into the current design attributes database 230 and the probabilistic model 240.

Once a new condition or design error is predicted or detected, or a known condition or error is predicted or detected, this information is preferably input to the knowledge base 210 and the TECAM matrix 220 as a new design-space state having objects such as tasks, conditions and design errors. Dependencies and interrelationships between tasks, conditions and design errors existing in the current design, and historical tasks, conditions and design errors identified in previous designs are preferably extracted from the TECAM matrix 220 and used to form the probabilistic model 240. The probabilistic model 240 of the interrelationships between tasks, conditions and design errors is then used by the inference engine 200 to identify and generate the probability distribution of design-space objects, such as, for example tasks, conditions, and design errors. The probability distribution of the design-space objects is preferably then used by the inference engine 200 at each design step to identify and compile likely errors, tasks introducing such errors, conditions to detect and isolate such errors, and conditional probabilities of the interrelationships between the objects in the design-space.

Figure 3:
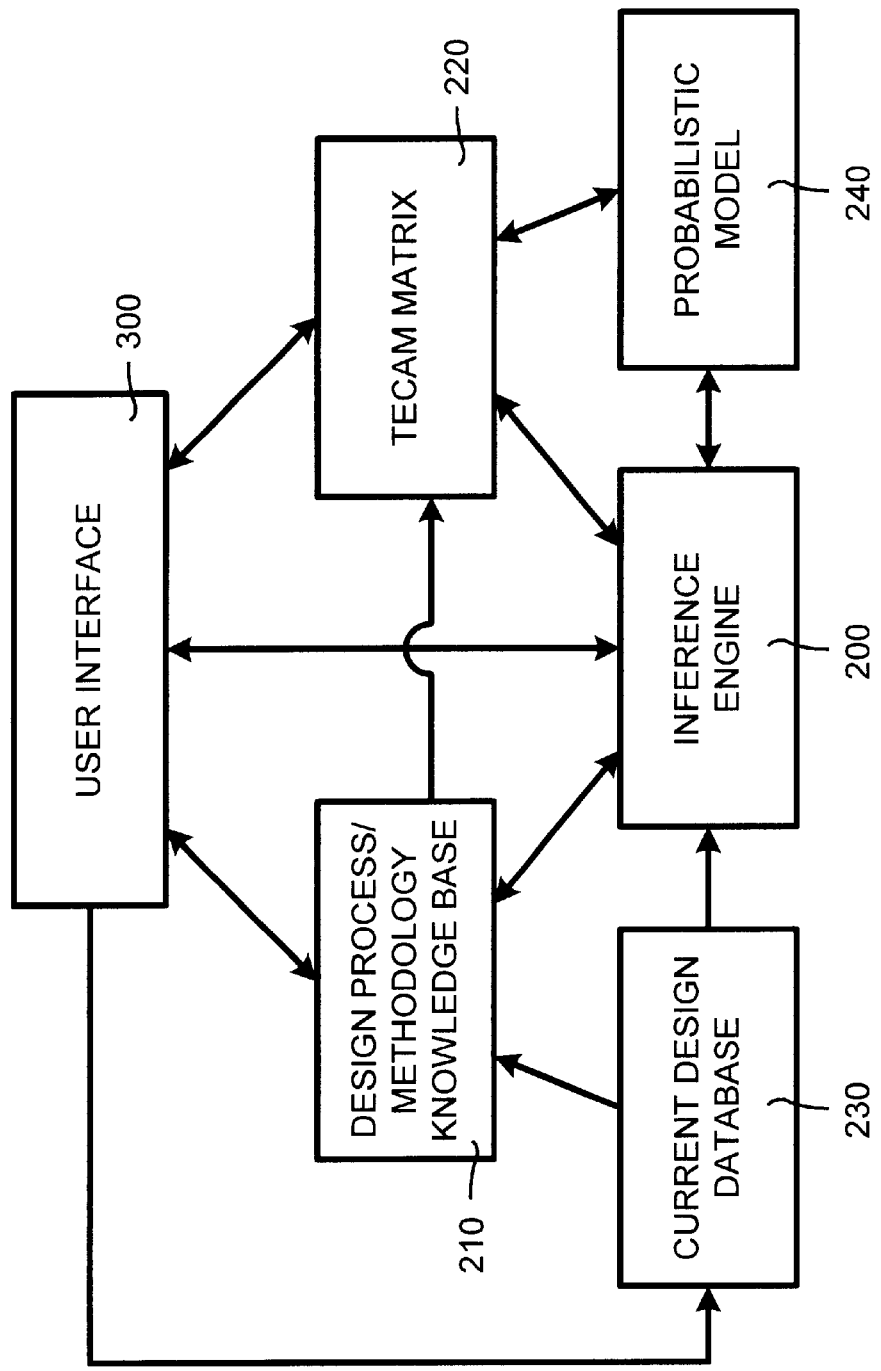
FIG. 3 is a general block/flow diagram illustrating one embodiment for implementing the present invention.

The system architecture and inference engine described above is preferably accessible to the user via a user interface as illustrated by the general block diagram of FIG. 3. FIG. 3 shows a user interface 300 for interacting with the system of the present invention. Specifically, the user interface 300 preferably provides a user with the capability to query the inference engine 200, query and edit the knowledge base 210, and query and edit the TECAM matrix 220. Further, the current design attributes database 230, is preferably also accessible from the user interface 300 so that current design information, such as, for example logic circuit design verification and simulation tests, results, and design states, may be entered and queried by the user.

Inference Engine

Referring back to FIG. 2 the inference engine 200 uses inexact reasoning, or in other words, probabilistic comparisons to identify plausible design errors and abnormal design-space states in an integrated circuit design. Further, The inference engine 200 also updates the historical design knowledge base 210 and the TECAM matrix 220 as described above.

The probabilistic model 240, such as a BBN, represents conditional probabilities and dependencies among variables in the TECAM matrix 220 as well as interdependencies among objects of the same class, such as a set of conditions, or a set of tasks. Consequently, the TECAM matrix 220 preferably initially generates the probabilistic model 240 by determining and providing the initial conditional probabilities and dependencies among variables to the probabilistic model.

When conditions or errors are predicted, or detected, the inference engine 200 preferably uses the probabilistic model 240 to generate and evaluate what-if type scenarios or cases. Consequently, once a task is completed, and conditions have been accurately predicted or detected, some conditions are preferably used to generate an advisory report or watch-list of all plausible conditions and errors in succeeding tasks. New inferences are also preferably made by the inference engine 200 based upon updated conditional probabilities and dependencies generated for the succeeding tasks.

Further, prior to beginning a task, or after a task is in progress, the inference engine 200 uses the probabilistic model 240 to extract a list of probable conditions dependent upon the task. Such a list is useful in serving as an advisory report of probable error conditions that are likely to arise during completion of the task. In other words, the advisory report warns the user of what to look for, along with side-effects and possible errors which may be caused by conditions which may arise during completion of the task. As the task progresses, and the design attributes database 230 is updated via the user interface to reflect the progress, the advisory report is also preferably automatically updated to reflect changes in the probability of conditions which may arise due to the ongoing design efforts of the task.

Another feature of the inference engine 200 is the ability of the inference engine to backtrack, or roll back, to the source of an error when the symptoms or conditions associated with a design error are predicted or detected. Towards this end, the inference engine 200 preferably uses the probabilistic model 240 to generate a list of all dependent and influencing conditions along with their corresponding conditional probabilities.

Figure 4:
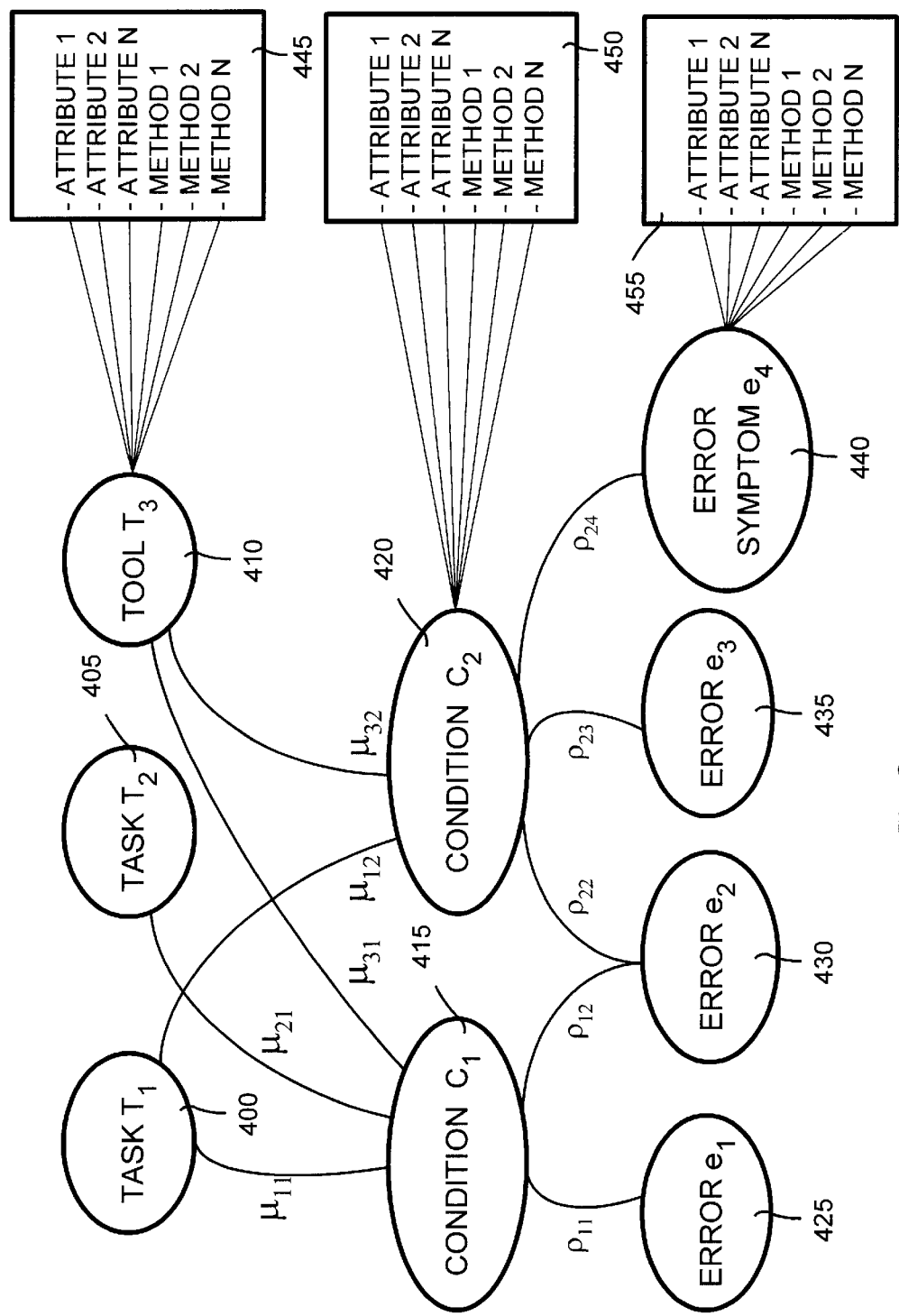
FIG. 4 is an exemplary probabilistic model in accordance with the present invention.

For example, the exemplary BBN of FIG. 4 illustrates a simple case with two tasks and one tool ($T_1$, $T_2$, and $T_3$), 400, 405 and 410 respectively, two conditions ($C_1$, and $C_2$), 400 and 405 respectively, three plausible errors and one plausible error symptom ($e_1$, $e_2$, $e_3$ and $e_4$), 425, 430, 435, and 440 respectively. The tasks, tools, conditions, errors and error symptoms (400, 405, 410, 415, 420, 425, 430, 435, and 440) represent the nodes of the BBN, while $\mu$ and $\rho$ represent the arcs of the BBN. Further, each of the tasks, tools, conditions, errors, and error symptoms (400, 405, 410, 415, 420, 425, 430, 435, and 440) are preferably defined by a plurality of attributes and methods (445, 450 and 455) which delimit the current design. Consequently, $\mu_m$ represents the probability that a particular condition $C_j$, will occur during a certain task $T_n$, while $\rho_m$ represents the conditional probability that a particular design error $e_i$ will occur when condition $C_j$ is observed or predicted during task $T_n$.

Therefore, using the exemplary BBN of FIG. 4, it is assumed that $e_2$ 430 has actually been predicted or detected, and thus the conditional probability associated with $e_2$ is 1. Consequently, where the user desires to determine the root cause or source of error $e_2$ 430, the status of $C_1$ 415 and $C_2$ 420 and then $T_1$ 400, $T_2$ 405 and $T_3$ 410 are updated by rolling back the new status, or conditional probability, of $e_2$ 430, by updating the conditional probabilities of each of the parent conditions, tasks, and tools accordingly. In rolling back the conditions and tasks, it should be noted that $\rho_{12}$ is the original confidence, or conditional probability, that $e_2$ 430 will occur during condition $C_1$ 415. Similarly, $\rho_{22}$ is the original confidence, or conditional probability, that $e_2$ 430 will occur during condition $C_2$ 420.

Consequently, with the new conditional probability for $e_2$ 430 a heuristic error associated with $C_1$ 415 and $\rho_{12}$ is preferably calculated by the inference engine 200 using an equation such as, for example, $(1-\rho_{12})$. Similarly, the heuristic error associated with $C_2$ 420 and $\rho_{22}$ is preferably calculated by the inference engine 200 using an equation such as, for example, $(1-\rho_{22})$. Using this information, a normalized heuristic error $He_2$, is preferably calculated to determine the heuristic error induced at $e_2$ by $C_1$ 415 and $C_2$ 420. $He_i$ is preferably then calculated by the inference engine 200 using Equation 1 as follows:

$$H_{e_i} = \frac{\sum_{j=1}^{J} H_{\rho_{ji}} \quad K - \sum_{j=1}^{J} \rho_{ji}}{K} = \frac{K - \sum_{j=1}^{J} \rho_{ji}}{K}$$

where K is defined as the number of arcs leading to $e_i$, and $H\rho_{ji}$ is zero if there is no arc between $C_j$ and $e_i$. Solving Equation 1 for $He_2$ using the assumptions of the above example, it can be shown that:

$$H_{e_2} = \frac{2-(\rho_{12}+\rho_{22})}{2}$$

Once the heuristic error associated with an error node has been determined by the inference engine 200, the inference engine uses this heuristic error to update the other conditional probability arcs $\rho_m$ associated with all conditions leading to that node, which as described above, represent the conditional probability that a particular design error $e_i$ will occur when condition $C_j$ is observed or predicted during task or tool $T_n$. Therefore, once the state of an error node has become known, the inference engine 200 then preferably calculates a heuristic error for each arc leading to that node. The conditional probability of the error node is preferably then updated, and the heuristic error is then preferably propagated to the parent levels to adjust the conditional probabilities of the arcs in accordance with the new conditional probability of the child error node. The inference engine 200 then updates the TECAM matrix 220 and generates a new advisory report as described above for investigating candidate conditions and tasks for identifying the most probable source or sources of the detected error.

Therefore, to continue with the above example where an error was either predicted or detected at node $e_2$ 430 of FIG. 4, the heuristic errors are propagated up through the BBN to calculate new conditional probabilities for $C_1$ 415 and $C_2$ 420. The induced heuristic error on $e_2$ 430 by $C_2$ 420, $HC_2e_2$, is preferably calculated by the inference engine as $HC_2e_2 = (1-\rho_{22})$. Similarly, the induced heuristic error on $e_2$ 430 by $C_1$ 415, $HC_1e_2$, is preferably calculated by the inference engine as $HC_1e_2=(1-\rho_{12})$. These heuristic errors are now in turn preferably propagated up the network to calculate new condition densities, $\mu_{11}, \mu_{12}, \mu_{21}, \mu_{31}$, and $\mu_{32}$. The inference engine 200 therefore preferably calculates the new $\mu_{11}$, using an equation such as, for example, $\mu_{11}=\mu_{11}+\mu_{11}(HC_1e_2,)$, which reduces to $\mu_{11}=2\mu_{11}-\mu_{11}\rho_{12}$. Similarly, the inference engine 200 preferably calculates a new $\mu_{21}$ using an equation such as, for example, $\mu_{12}=2\mu_{12}-\rho_{22}$, and a new $\mu_{31}$ as $\mu_{21}=2\mu_{21}-\mu_{21}\rho_{12}$. Similar calculations are preferably made for $\mu_{31}$ and $\mu_{32}$. Once the new condition densities are calculated by the inference engine 200, they are normalized and the advisory report is updated to reflect the new conditional probabilities.

A similar feature of the inference engine 200, is the ability of the inference engine to roll forward in a design from the point where new conditions or symptoms are predicted or detected to analyze the effect such conditions or symptoms may have on the overall design performance and functionality, and whether such conditions and symptoms are actually caused by or are likely to produce design errors. Towards this end, once a condition becomes known (predicted or detected) during a task or tool, the inference engine 200 preferably calculates an induced error of the corresponding condition density $H\mu_{nj}$ as $(1-\mu_{nj})$. This induced error is then rolled forward to all child nodes in the probabilistic model, and the corresponding error densities ($\rho_{ji}$) are preferably updated by the inference engine 200 accordingly in a fashion preferably similar to that discussed above for rolling back to the source of an error, such that the new $\rho_{ji}$ may be calculated as $\rho_{ji}=\rho_{ji}+\rho_{ji}(1-\mu_{nj})$.

Figure 5:
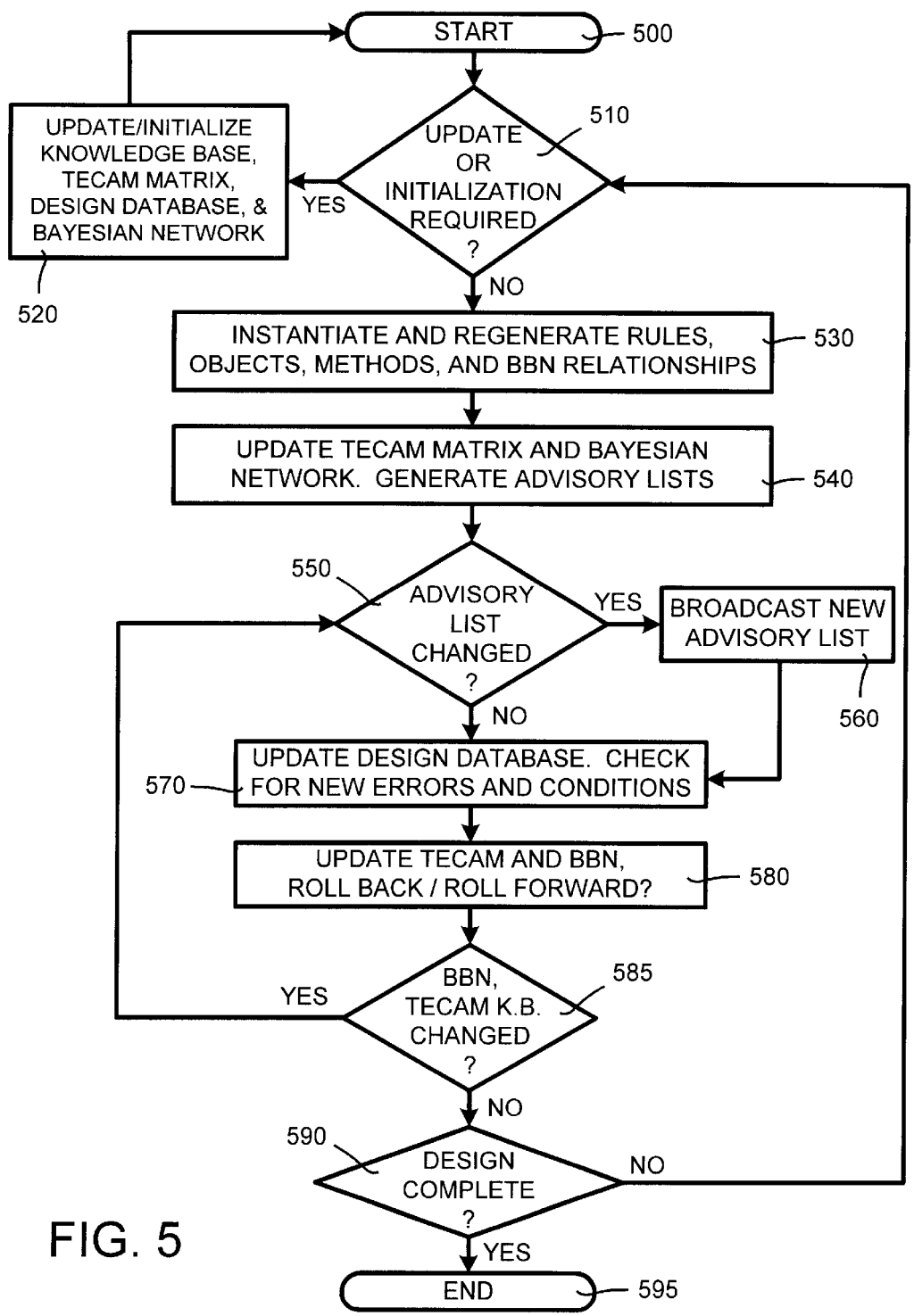
FIG. 5 is an exemplary flow diagram for an inference engine in accordance with the present invention.

FIG. 5 is a flowchart that illustrates a preferred operation of the inference engine in driving the error prediction, detection and correction capabilities of the present invention. Specifically, the inference engine is preferably started (Box 500) at any stage of the design. If updates are required to the historical design knowledge base (Box 510), the TECAM matrix, the design attributes database, or the BBN, the updates are preferably completed at this time (Box 520). In addition, changes in conditional probabilities instantiated by these updates are preferably propagated through the BBN until no more changes are required. As described above, updates to the historical design knowledge base and design attributes database are preferably made automatically by the inference engine, or manually by the user via the user interface. Updates to the TECAM matrix and the probabilistic model are preferably performed automatically by the inference engine as described above.

Once the updates and changes to conditional probabilities are complete, the inference engine preferably propagates those changes to the knowledge base, which in turn preferably triggers a set of rules, objects and methods (Box 530) associated with the components or data contained in the knowledge base. The TECAM matrix and the BBN are then automatically updated by the inference engine to reflect the triggered rules, objects, and methods, and an advisory report or list is generated (Box 540) as described above. If the advisory list has changed from any previously generated advisory list (Box 550), the new advisory list is preferably broadcast (Box 560), via the user interface. Because of the importance of detecting design errors as early as possible, the user interface preferably has one or more alarms (not shown) such that if the advisory list is updated, the user interface is capable of automatically notifying the user by methods such as, for example, an audible alarm, a visible warning message, an automatic fax to one or more preprogrammed telephone numbers, a page, an automatically generated voice message, or an e-mail message to at least one recipient.

Following the broadcast of the new advisory list, or when the advisory list has not changed, the design attributes database is preferably updated automatically by the inference engine, or manually by the user via the user interface (Box 570) as the design naturally progresses, at which time the inference engine then preferably checks for new errors and new conditions based upon the new inputs to the design attributes database. If new errors are detected, the inference engine preferably rolls back the design as described above, and updates all effected conditions, tasks, conditional probabilities, and condition and error densities as described above (Box 580). Further, if new conditions have been detected, the inference engine preferably rolls forward the design as described above, and updates all effected conditions, tasks, conditional probabilities, and condition and error densities as described above (Box 580). Following roll back or roll forward of the design, the inference engine preferably checks to see if the BBN, TECAM matrix, or the knowledge base has been changed or updated (Box 585), and if so, the inference engine then checks to see if the advisory list has changed (Box 550), and generates a new list and notifies or alerts the user (Box 560) as described above, if necessary.

If the inference engine did not roll back or roll forward the design because no new conditions or errors were detected, the inference checks to see if the design is complete (Box 590). If the design is not complete, the inference engine checks to see if updates are again required (Box 510). If updates are required, they are again provided (Box 520) via the user interface as described above. The procedures described above preferably continue until the design is complete (Box 595).

Historical Knowledge Base

The historical design knowledge base (210 of FIG. 2 and FIG. 3) preferably includes information detailing the collected information from prior designs. This information preferably includes data such as, for example, previously identified design errors, and symptoms and conditions associated with those errors. In other words, the historical design knowledge base includes prior design verification and design error debugging data, as well as tasks performed, attributes of each task, tools utilized, and attributes of each tool, such as, for example, input and output criteria, tool parameters, and condition codes created or generated by the tool.

TECAM Matrix

Referring back to FIG. 2, the TECAM matrix 220 is a dynamic active data structure or matrix that is preferably formed using an aggregate of tasks, errors and conditions. The TECAM matrix 220 preferably represents and models design tasks (T), design-space state conditions (C), condition density ($\mu$), design errors (E), and error density ($\rho$). The TECAM matrix 220 is a dynamic multifaceted tool, that interacts with the knowledge base 210 and the inference engine 200, and initially populates and updates the probabilistic model 240.

The TECAM matrix 220 is preferably addressable via the user interface, as described above, for the purpose of editing and updating the matrix. Further, the TECAM matrix 220 is also preferably updated automatically directly from the knowledge base 210 when new objects, such as, for example, conditions, tasks and errors, new probabilities derived by the probabilistic model 240, or new inference results derived by the inference engine 200 enter the knowledge base. Further, the TECAM matrix 220 is also preferably updated directly from the inference engine 200 as new probabilistic relationships are inferred by the inference engine.

Figure 6:
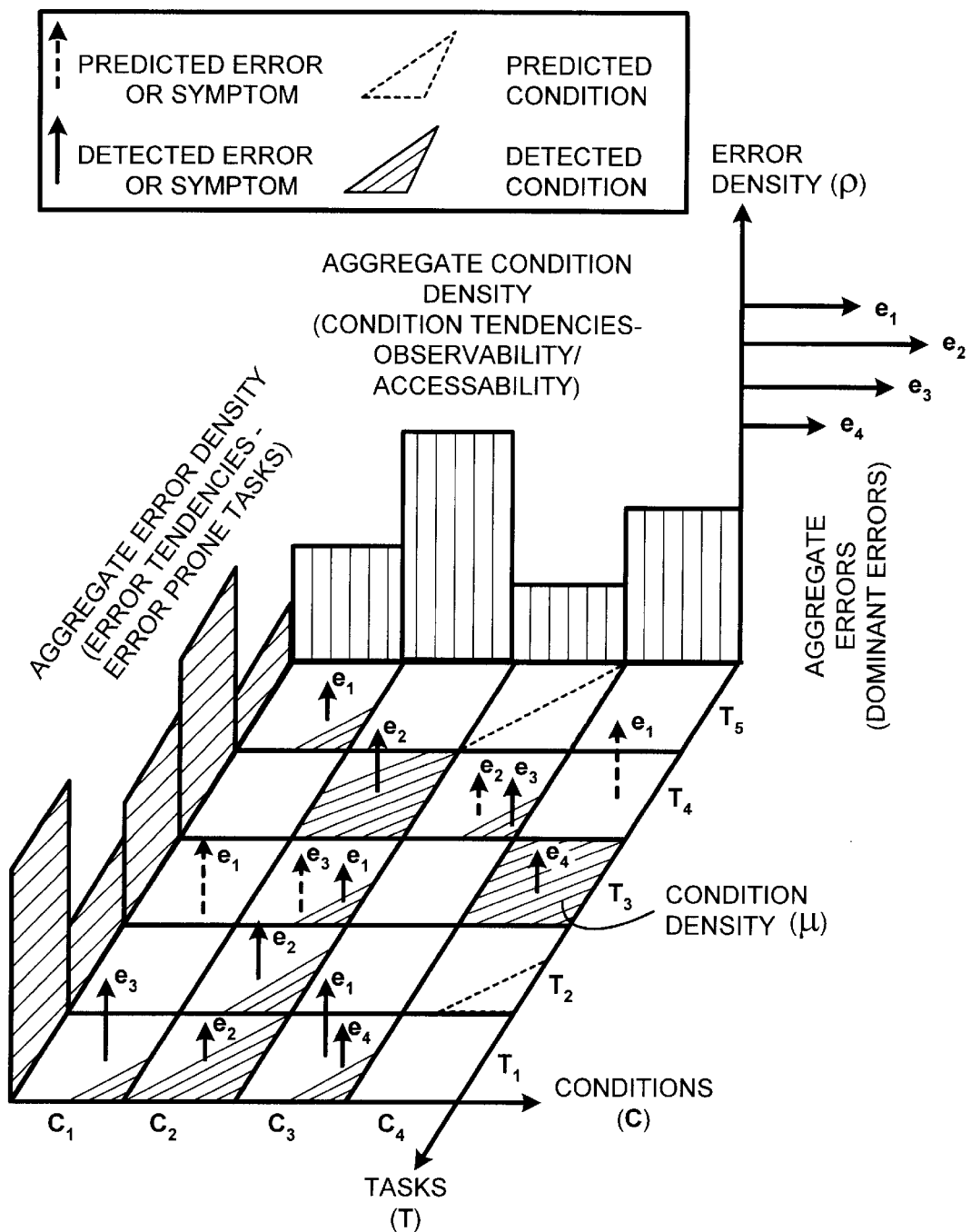
FIG. 6 is an exemplary graphical representation of a task, error, condition aggregate matrix in accordance with the present invention.

As illustrated in FIG. 6, an exemplary graphical display of the TECAM matrix 220 preferably includes a visual representation of design tasks (T), predicted and detected design-space state conditions (C), condition density ($\mu$), predicted and design errors (E), error density ($\rho$), and side-wall aggregate charts of error density, condition density, and design errors. User interactivity with the graphical display of the TECAM matrix 220 preferably provides the user with the ability to retrieve information for specific objects, such as conditions or errors, by clicking on, or otherwise activating any of the objects displayed on the TECAM matrix. The information provided to the user preferably includes detailed information on the history of the selected object, as well as the properties of that object.

Further, because the graphical display of the TECAM matrix 220 can become very complicated where multiple conditions are associated with single errors, the present invention preferably provides the capability to either view the TECAM matrix in its entirety, to zoom into the display, such that one or more intersections of tasks and conditions may be viewed at the desired level of detail, or selectively highlight or hide one or more specific tasks, conditions, or errors. In other words, the user may selectively display the specific information within the TECAM matrix that he or she is interested in by interacting with the user interface, while ensuring that the display is not unduly cluttered or complicated by information or data not of interest to the user.

For each intersection of a task (T), and a condition (C), all corresponding known error symptoms, or sets of error symptoms are displayed as directed arrows with their height indicating their relative error density ($\rho$). The error density ($\rho$) is the relative confidence or probability that a design error $e_i$ will occur during condition $C_j$ in task $T_n$. In other words, $\rho$ represents the conditional probability that a particular design error will occur when condition $C_j$ is observed or predicted during task $T_n$. Therefore, the error density ($\rho$) is a measure of the degree to which the error symptom or symptoms corresponds to a known historical condition (C) during a particular task (T). Consequently, the length of the directed arrow indicating the error density, displayed on the TECAM matrix, preferably increases as the calculated probability that one or more error symptoms matches one or more known conditions increases. Because conditions may or may not be completely or partially observable, the degree of observability of the condition density ($\mu$) is preferably graphically indicated by shading all or part of a square representing the intersection of a task (T), and a condition (C). Therefore, the condition density ($\mu$) is preferably an indication of the relative confidence or probability that condition $C_j$ will be observable during a particular task $T_n$. In other words, $\mu_m$ represents the conditional probability that a particular condition $C_j$, will occur during a certain task $T_n$.

The aggregate error density ($A_\rho$) is preferably the sum of all error densities ($\rho$) for all conditions (C) for a particular task $T_n$, and may be defined by an equation such as, for example, Equation 2 as follows:

$$A_{\rho T_n} = \sum_{j=1}^{J} \rho_{ji}$$

The aggregate condition density ($A_\mu$) is preferably the sum of all condition densities $\mu$ for all tasks $T_n$ for condition $C_j$, and may be defined by an equation such as, for example, Equation 3 as follows:

$$A_{\mu C_j} = \sum_{n=1}^{N} \mu_{nj}$$

The aggregate error ($Ae_i$) is preferably the sum of all occurrences of a specific error $e_i$ for all conditions C in all tasks T, and may be defined by an equation such as, for example, Equation 4 as follows:

$$A_{e_i} = \sum_{n=1}^{N} \sum_{j=1}^{J} \rho_{ji}$$

In view of the previous definitions and discussions, the behavior of objects within the TECAM matrix may be represented mathematically by defining the set of possible symptoms and all their corresponding conditions. Specifically, the set of design tasks, $T=\{T_1, T_2, T_3, \ldots, T_n\}$; the set of conditions, $C=\{C_1, C_2, C_3, \ldots, C_j\}$; and the set of design errors, $E=\{e_1, e_2, e_3, \ldots, e_i\}$.

Tasks may be further defined as a logical OR of all conditions (C) for task $T_n$. Consequently, $T_n$ may be defined by an equation such as, for example, Equation 5 as follows:

$$T_n = \bigvee_{j=1}^{J} C_j$$

where J is equal to the total number of conditions $C_j$ observed during the task $T_n$. Consequently, a task $T_n$ can be described as an unordered disjunction of all conditions $C_j$ which either can be, or have been predicted or observed during the task. For example, as illustrated in FIG. 6, $T_1=\{C_1, C_2, C_3\}$.

Errors may be further defined in terms of all conditions that cause errors and the tasks where such conditions occur. Consequently, $e_i$ may be defined by an equation such as, for example, Equation 6 as follows:

$$E_i = \bigvee_{n=1}^{N} \bigwedge_{j=1}^{J} C_j$$

where J is again equal to the total number of conditions $C_j$ predicted or observed during the task $T_n$, and N is preferably an integer variable that restricts the number of simultaneous conditions that may be predicted or observed during a particular task. In other words, $E_i$ is a logical OR ed set of logical AND ed conditions $C_j$ across all tasks $T_n$. For example, in the case where N is set equal to two, a maximum of two simultaneous conditions may be observed for the purpose of predicting or detecting design errors. Therefore, for example, as illustrated in FIG. 6, error $E_2=\{C_2, C_2C_3\}$, where conditions $C_2$, or $C_3$, may occur or be predicted or observed either singly or in pairs during task $T_1$, $T_2$, or $T_4$. While this example illustrates a generic case where an N value of two was used to limit the number of simultaneous conditions to two, larger integer N values may be used to increase the number of simultaneous conditions that may be examined or analyzed in the prediction or detection of design errors.

Errors may be further represented by an error-condition matrix where:

$$E_i = \begin{vmatrix} a_{11} & a_{12} & a_{13} & \cdots & a_{1n} \\ a_{21} & a_{22} & a_{23} & \cdots & a_{2n} \\ \vdots & \vdots & \vdots & \cdots & \vdots \\ a_{k1} & a_{k2} & a_{k3} & \cdots & a_{kn} \end{vmatrix} \text{ where } a_{kn} = \begin{vmatrix} 1 \text{ if } C_n \in e_k \\ 0 \text{ if } C_n \notin e_k \end{vmatrix}$$

Further, the conditional probability associated with specific errors may be represented by an error-condition probability matrix where:

$$PE_i = \begin{vmatrix} Pa_{11} & Pa_{12} & Pa_{13} & \cdots & Pa_{1n} \\ Pa_{21} & Pa_{22} & Pa_{23} & \cdots & Pa_{2n} \\ \vdots & \vdots & \vdots & \cdots & \vdots \\ Pa_{k1} & Pa_{k2} & Pa_{k3} & \cdots & Pa_{kn} \end{vmatrix} \text{ where } 0 \leq Pa_{kn} \leq 1$$

These exemplary matrices and mathematical representations are preferably used for generating and processing the TECAM matrix, as well as for automatic detection and manipulation of tasks, conditions, and errors.

Design Attributes Database

As mentioned previously, the design attributes database (230 of FIG. 2 and FIG. 3) preferably contains current information and data delimiting current design attributes. Further, this design attributes database preferably includes information such as, for example, design verification and simulation tests, test results, and current design states, as well as tools used, tasks completed, and current tasks and conditions observed. The design attributes database is preferably updated as the design progresses, such that the design attributes database preferably reflects the current states of the design.

Probabilistic Model

Design error analysis, as well as error prediction and detection is typically an ambiguous and thus uncertain task. Rule based expert systems generally do not deal well with uncertainty. Consequently, computer analysis, prediction and detection of design errors is preferably performed using probabilistic inferential reasoning, often referred to as fuzzy inferencing. Towards this end, a probabilistic model capable of dealing with a plurality of sets of variables having dynamic interdependencies represented with conditional probabilities, such as: $P(E_n|D_i, T_n, C_j)=P_e$. Assuming the design $D_i$ is true, task $T_n$, is active, and condition $C_j$ is observed, there is a probability $P_e$ that design error $E_n$ will occur. Such conditional probabilities are well represented by probabilistic models, such as, for example, a BBN.

A BBN has a strong relationship between nodes, and is typically represented as a Directed Acyclic Graph (DAG) in which nodes represent variables, the arcs signify the existence of direct causal influence between the linked variables, and the strengths of these influences are expressed by forward conditional probabilities. Nodes of a BBN are not necessarily in a particular state; each node maintains the equivalent of a table of probabilities that each state will occur.

In terms of the present invention, the BBN provides a convenient way to use known information, such as, for example, tasks, conditions, condition probabilities, and error probabilities, to generate conditional probabilities of various possible scenarios that could produce observed or predicted evidence, such as conditions or errors. Consequently, the BBN, as implemented in the present invention, may be viewed as an inference instrument for deducing new interdependence relationships between the variables used in initially constructing the BBN. This capability allows the present invention to determine whether a tool being used in the design process, or a condition predicted or detected during the design process should trigger the inference engine. To formulate a BBN representation of the TECAM matrix described above, an aggregate network of 1–1 mapping and single error leaf-node networks is preferably generated.

For example, design $D_1$ may utilize tasks $T_1$ and $T_2$, with two conditions, $C_1$, and $C_2$ having been identified as being observable for tasks $T_1$ and $T_2$. Further, three design errors $e_1$, $e_2$ and $e_3$, may have been traced back to conditions $C_1$, and $C_2$ in prior designs. This simple example may be represented by a TECAM matrix similar to the TECAM matrix of FIG. 6. Further, the initial probabilistic model representing this example may be illustrated by the BBN of FIG. 4. Error dependency networks are then generated for each error $e_i$ from the probabilistic model represented by the BBN.

The inference engine is then preferably started when one of the error dependency networks indicates that an error $e_i$ is likely to be predicted or detected. When the status of a node of the BBN becomes available or visible all parent nodes become detectable based on the arcs conditional probability ($\mu$ or $\rho$), and all dependent child nodes become predictable based on all the active arcs conditional probabilities. Consequently, the dependency information in the BBN, in conjunction with a heuristic rule set, generated based upon historical expert knowledge, preferably enables detection of the root source or cause symptoms or conditions creating the design errors.

Working Examples

The following descriptions and associated figures are for illustrative purposes only and are not intended to be limiting. These descriptions delineate methods for predicting, detecting and recovering from design errors in accordance with the present invention.

Design Error Prediction

As discussed previously, design error prediction is based on historical design errors in prior designs, in combination with historical information regarding the structure of the design environment and the conditions associated with the historical design errors. Once abnormal, out of specification, or unstable design states are observed, these conditions are rolled forward, as described above, to identify potential errors, or the conditional probability of design errors in future steps. In other words, prior to the actual occurrence of an error, the system and method of the present invention predicts probable future errors based upon detected or predicted conditions.

Figure 7:
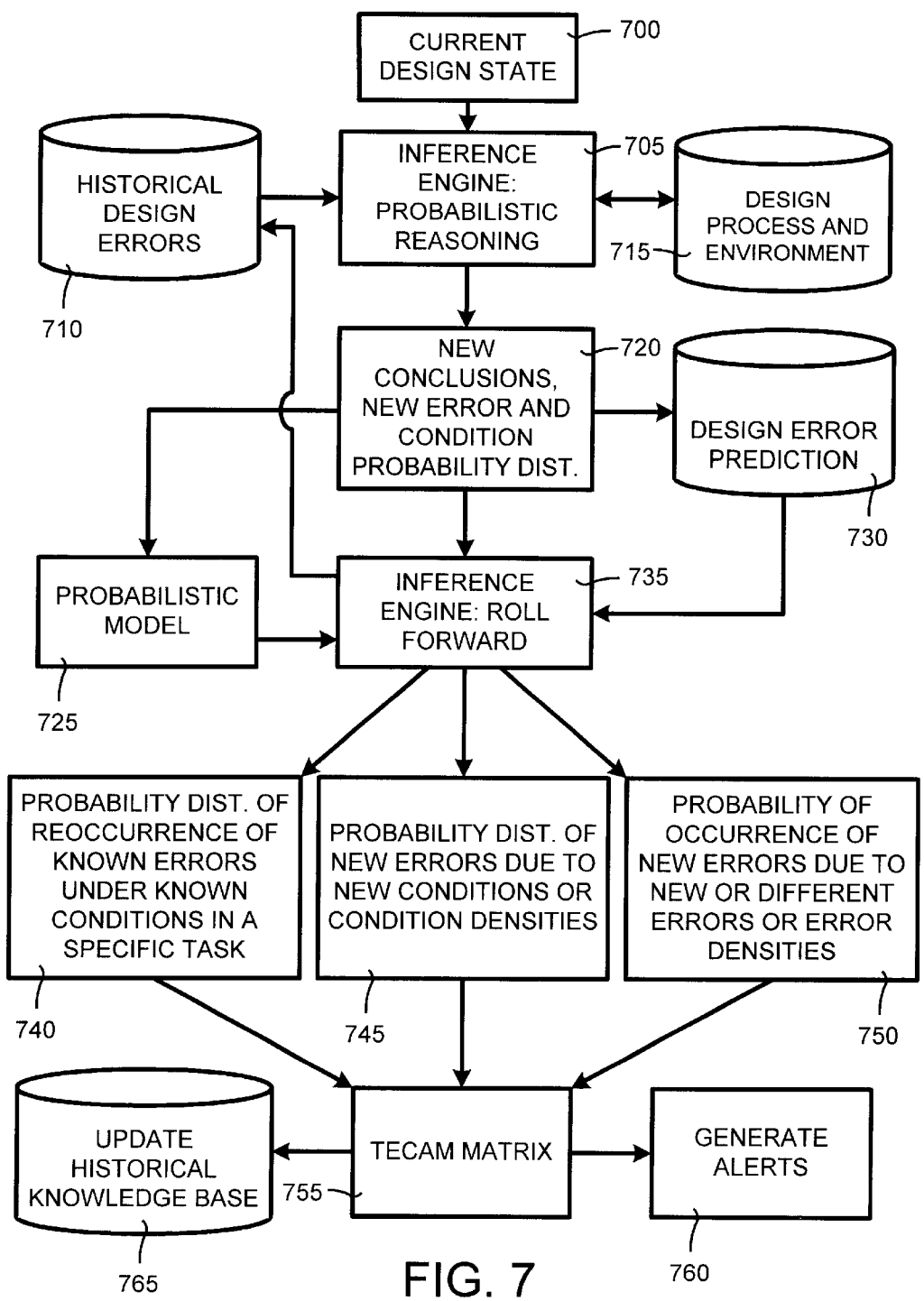
FIG. 7 is an exemplary architectural flow diagram illustrating an inference engine used for design error prediction in accordance with the present invention.

FIG. 7 is an exemplary architectural flow diagram illustrating an inference engine used for design error prediction in accordance with the present invention. Design error prediction preferably commences by extracting the current design state from the design attributes database (Box 700), and providing that information to the inference engine (Box 705). The historical design error knowledge base is then scanned for relevant data (Box 710), such as, for example, errors that have occurred in prior designs at the current or prior steps of the current design, or for current or prior tools or tasks associated with exact or similar errors in historical designs. Further, this historical information preferably also includes data such as, for example, what specifically happened to induce the error, when the error occurred and what was being done at that time, how the error was detected, and how the error was fixed.

At the same time, the current design state is preferably mapped to a design process and environment database (Box 715) by the inference engine to identify preceding and succeeding tasks, alternative tasks, conditions, inputs, outputs, success criterion for current and prior design steps, and design attributes that are usually changed at current and prior design steps. The results of the previous two steps (Box 710 and 715) are then compiled to form conclusions, exact matches, new errors, and conditional probability densities (Box 720). This information is then used to update the dependencies and interrelationships between objects such as tasks, tools, conditions, errors, and error symptoms representing the BBN (Box 725) to determine new dependencies and values for the tasks, tools, conditions, errors and error symptoms, and new conclusions, rules, objects, and schemas for updating a design error prediction database (Box 730). Changes within the BBN (Box 725) and the design error prediction database (Box 730) preferably cause new rules, classes, and objects to be instantiated in the inference engine (Box 735). Further, such changes then preferably trigger the roll forward prediction capabilities of the inference engine.

The roll forward capabilities of the inference engine then preferably infer new conclusions, updated probability distribution of errors and conditions, and new error objects. This information is then preferably presented as one of three classifications; known errors (Box 740); new errors arising from new conditions (Box 745); and new errors arising from other observed errors or error densities (Box 750).

For example, as for Box 740, known errors $e_1, e_2, \ldots e_i$, occur under conditions $C_1, C_2, \ldots C_j$ during tasks $T_1, T_2, \ldots T_n$ with corresponding conditional probabilities of $P_1, P_2, \ldots P_m$, where $P_m=P(e_i|D_m, C_j, T_e)$. Thus, during design $D_m$, if condition $C_j$ is observed when task $T_n$ is active, then error $e_i$ occurs with probability $P_m$.

As for Box 745, new errors, $e_1, e_2, \ldots e_i$, occur under new conditions $C_1, C_2, \ldots C_j$, corresponding to condition densities $\mu_1, \mu_2, \ldots \mu_m$, with conditional probabilities of $P_1, P_2, \ldots P_m$, where $P_m=P(e_i|D_m, C_j\mu_m)$.

As for Box 750, new errors, $e_1, e_2, \ldots e_i$, occur based on observed errors $e_1, e_2, \ldots e_j$, with corresponding error densities $\rho_1, \rho_2, \ldots \rho_n$, with conditional probabilities of $P_1, P_2, \ldots P_m$, where $P_m=P(e_i|D_m, e_i, \rho_n)$.

Finally, new conditional probabilities and densities are propagated to the TECAM matrix (Box 755). All corresponding components are then preferably updated, changes are highlighted, and any change causing a programmable threshold trigger will preferably generate an audible or visible alarm (Box 760), as described above, and log the data into the advisory report for later analysis and display by the user. At the same time, the historical knowledge base is also preferably updated (Box 765) with the error information described above.

Figure 8:
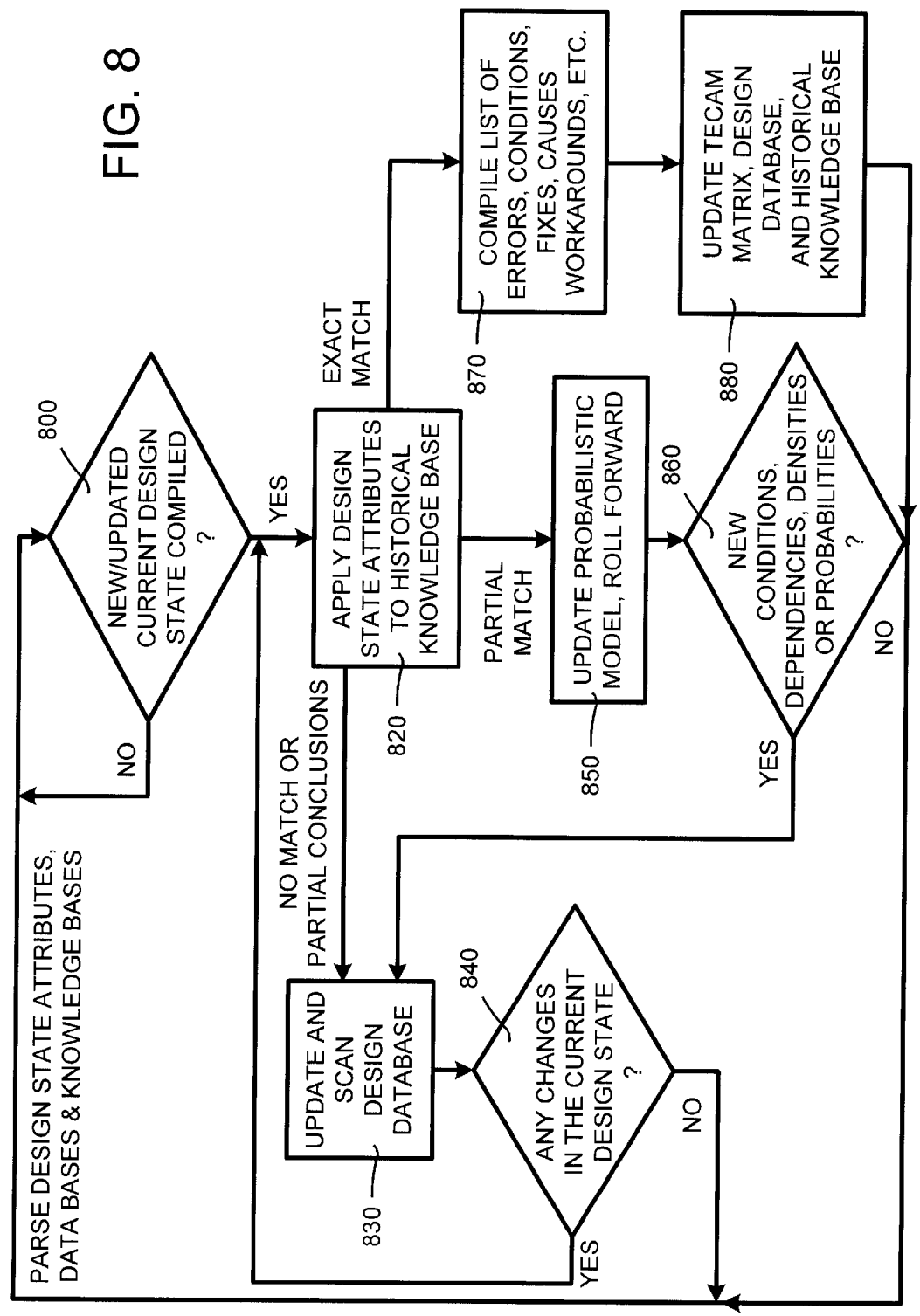
FIG. 8 is an exemplary functional flow diagram illustrating an inference engine used for design error prediction in accordance with the present invention.

The architectural flow diagram of FIG. 7 may be further summarized by the design error prediction process flow chart of FIG. 8. FIG. 8 shows that an inference engine according to the present invention is preferably triggered by new or updated design state information for the current design (Box 800). Once the updated design information is received by the inference engine, the inference compares the current design state attributes to data from the historical knowledge base (Box 820), as described above.

If no match or abnormality is found by the comparison, the inference engine compares current design state attributes to those of historical design processes (Box 830) to identify relevant tasks, conditions and attributes which may require further examination, thereby resulting in a new, updated, or modified current design profile (Box 840). If the current design profile is unchanged, the system preferably returns to Box 800 to await additional updated design state information. However, if the current design profile is updated or modified, the inference engine will preferably use this new information to again compare the current design state attributes to data from the historical knowledge base (Box 820), as described above.

If a partial match, or abnormal condition is detected by the inference engine (Box 820), then the BBN will be updated, and any changes to dependencies and conditional probabilities are preferably propagated through the BBN (Box 850) as described above, to identify new conditions, errors, dependencies, condition and error densities, and conditional probabilities (Box 860). If new conditions, errors, dependencies, condition and error densities, or conditional probabilities are identified, then the inference engine again preferably compares current design state attributes to those of historical design processes (Box 830) to identify relevant tasks, conditions and attributes which may require further examination, thereby resulting in a new, updated, or modified current design profile (Box 840). However, if new conditions, errors, dependencies, condition and error densities, or conditional probabilities are not identified (Box 860), then the system preferably returns to Box 800 to await additional updated design state information.

If an exact or similar match is detected by the inference engine (Box 820), the inference engine preferably compiles an advisory list including data elements such as, for example, conditions, errors, solutions to the errors, cause of the error, the probability that the identified solution is appropriate, the probability that the cause is correctly identified, tools affected, and tools implicated in causing the error (Box 870). The TECAM matrix and the historical knowledge base are then preferably updated (Box 880). The system of the present invention then preferably returns to Box 800 to await additional updated design state information.

Design Error Detection

As described above, design error detection deals with design scenarios where at least one design error has already occurred. The existence of such an error is typically indicated by an anomalous design state, as described above. Therefore, once an abnormal, out of specification, or unexpected condition or design attribute is observed, the condition is rolled back, as described above, to detect the error by identifying the root cause of the anomalous condition.

Figure 9:
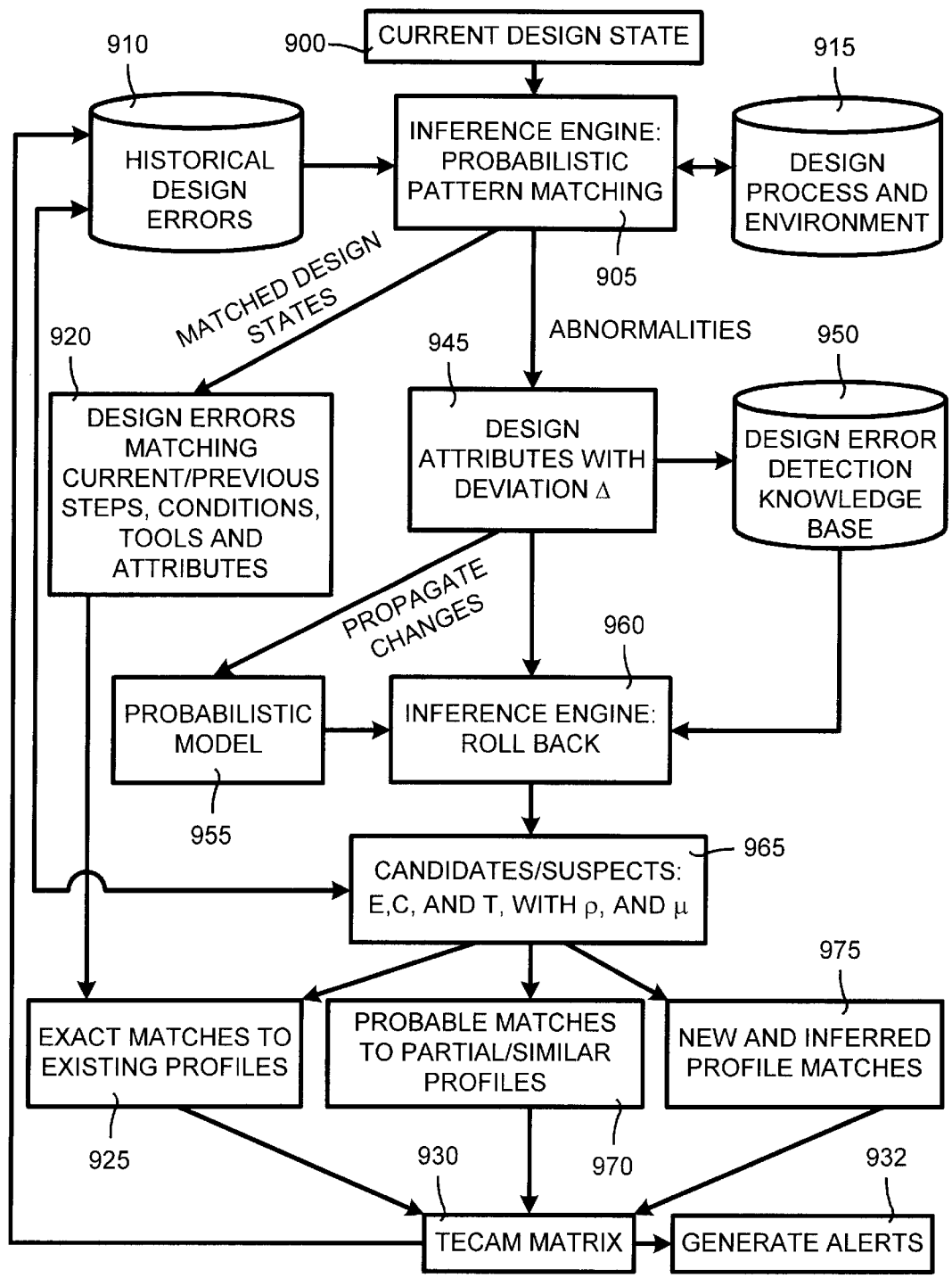
FIG. 9 is an exemplary architectural flow diagram illustrating an inference engine used for design error detection in accordance with the present invention.

FIG. 9 is an exemplary architectural flow diagram illustrating an inference engine used for design error detection in accordance with the present invention. FIG. 9 illustrates a dynamic error detection algorithm that continuously monitors the current design space to detect design errors. Design error detection preferably commences by extracting the current design state from the design attributes database (Box 900), and providing that information to the inference engine (Box 905).

The historical design error knowledge base is then scanned for relevant data (Box 910), such as, for example, errors that have occurred in prior designs at the current or prior steps of the current design, or for current or prior tools or tasks associated with errors in historical designs. Further, this historical information preferably also includes data such as, for example, what specifically happened to induce the error, when did the error occur and what was being done at that time, how was the error detected, and how was the error fixed. At the same time, the current design state is preferably mapped to a design process and environment database (Box 915) by the inference engine to perform probabilistic pattern matching between the current and historical design states. As described above, design states preferably contain information such as, for example, current and previous design steps, conditions, tools, and attributes, alternative tasks and tools, and task exit criteria.

When a current design state is exactly matched (Box 920) to a known historical design state associated with a known historical design error the advisory report is updated with the details from the historical design error knowledge base indicating the root cause of the design error in the current design (Box 925). As described above, this historical information preferably includes data such as, for example, what specifically happened to induce the error, when the error occurred and what was being done at that time, how the error was detected, and how the error was fixed. The TECAM matrix is then preferably updated to reflect the occurrence of the design error in the current design (Box 930). In addition, the historical design error knowledge base is preferably updated to indicate the occurrence of the design error in the current design (Box 910). At the same time, an audible or visible alarm is preferably generated as described above (Box 932) to indicate that the root cause of the design error in the current design has been detected.

Alternatively, when the inference engine determines that probabilistic pattern matching of Box 905 indicates that an abnormal design state in the current design partially matches a historical design state associated with a known historical design error within a preferably programmable deviation (Box 945), the current abnormal design state is applied to a design error detection knowledge base (Box 950). The new error and condition probabilities associated with this abnormal design state are preferably then propagated to the BBN (Box 955).

The conditional probabilities of the BBN (Box 955) are preferably then calculated and provided to the inference engine (Box 960) as well as updated design error candidates from the design error detection knowledge base (Box 950). The inference engine (Box 960) then rolls back the new error densities ($\rho$) of the BBN, and calculates new induced heuristic errors for all conditions leading to each error node of the BBN. The resulting updated values of the condition densities ($\mu$) of the BBN are preferably then analyzed by the inference engine (Box 965) with respect to the candidate tasks, conditions and errors from the historical design error knowledge base (Box 940) to identify the conditions with the largest normalized deviation from expected values, and the tasks associated with those conditions. These identified tasks are then further analyzed by the inference engine (Box 965) with respect to the historical design error knowledge base (Box 940) to identify any exact matches (Box 925), or probable or partial matches (Box 970). Task candidates with no exact or probable match to historical tasks associated with design errors are preferably sorted for manual investigation (Box 975).

As discussed previously, When a current task is exactly matched to a known historical design task associated with a known historical design error, an audible or visible alarm (Box 932) is preferably generated as described above, and the advisory report is updated with the details from the historical design error knowledge base indicating the root cause of the design error in the current design (Box 925). When a current task partially or probabilistically matches to a known historical design task associated with a known historical design error, the watch list is updated with information regarding the probable source of the error. Again, audible or visible alerts (Box 932) preferably indicate that a probable error source has been detected.

Finally, as with error prediction, the TECAM matrix is then preferably updated to reflect the occurrence of the design error in the current design (Box 930). In addition, the historical design error knowledge base is preferably updated to indicate the occurrence of the design error in the current design (Box 910).

Figure 10:
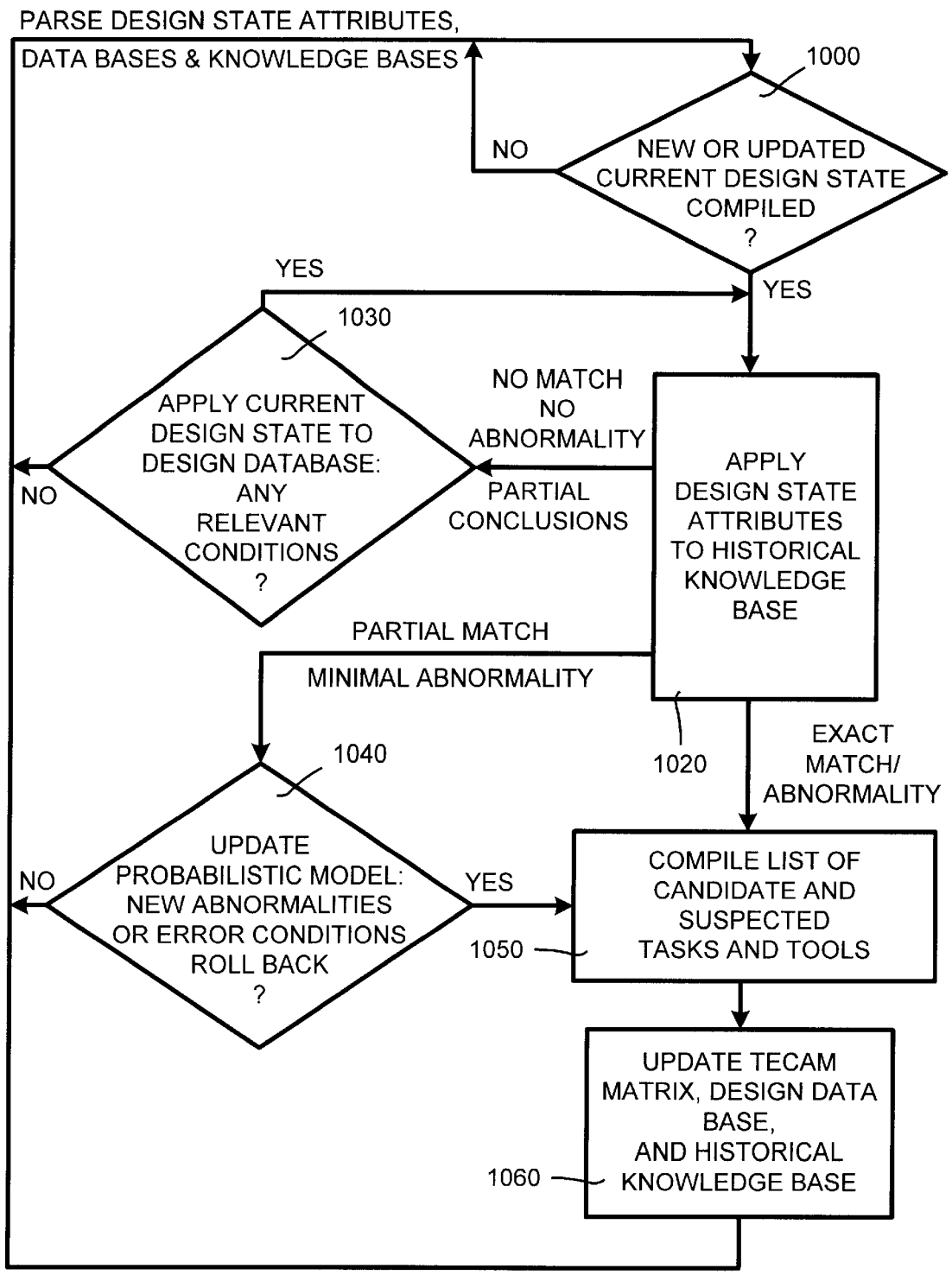
FIG. 10 is an exemplary functional flow diagram illustrating an inference engine used for design error detection in accordance with the present invention.

The architectural flow diagram of FIG. 9 may be further summarized by the design error detection process flow chart of FIG. 10. FIG. 10 shows that an inference engine according to the present invention preferably waits for new or updated design state information for the current design (Box 1000). Once the updated design information is received by the inference engine, the inference compares the current design state attributes to data from the historical knowledge base (Box 1020), as described above.

If no match or abnormality is found by the comparison, the inference engine compares current design state attributes to those of historical design processes (Box 1030) to identify relevant tasks, conditions and attributes which may require further examination, thereby resulting in a new, updated, or modified current design profile. If the current design profile is unchanged, the system preferably returns to Box 1000 to await additional new or updated design state information. However, if the current design profile is updated or modified, the inference engine will preferably use this new information to again compare the current design state attributes to data from the historical knowledge base (Box 1020), as described above.

If a partial match, or partially abnormal condition is detected by the inference engine (Box 1020), then the BBN will be updated, and any changes to dependencies and conditional probabilities are preferably propagated through the BBN (Box 1040) as described above, to identify new abnormalities and error profiles. If new abnormalities or error profiles are identified, then the inference engine preferably compiles an advisory or warning list of candidate or suspected tasks and conditions for each abnormality or error profile (Box 1050). Similarly, when an abnormal condition, out of specification attribute, or probable error profile is identified by the inference engine (Box 1020), the inference engine again preferably compiles an advisory or warning list of candidate or suspected tasks and conditions for each abnormality or error profile (Box 1050).

As described above, the user interface of the present invention preferably alerts or notifies the user when the advisory list is updated or changed in any way. Once the advisory or warning list is updated, the TECAM matrix and the historical knowledge base are then preferably updated (Box 1060) using the information compiled for the advisory or watch list. Further, post design feedback from the TECAM matrix is also preferably used to update the historical knowledge base (Box 1060). The system of the present invention then preferably returns to Box 1000 to await additional updated design state information, or information from a new design.

Design Error Recovery

Figure 11:
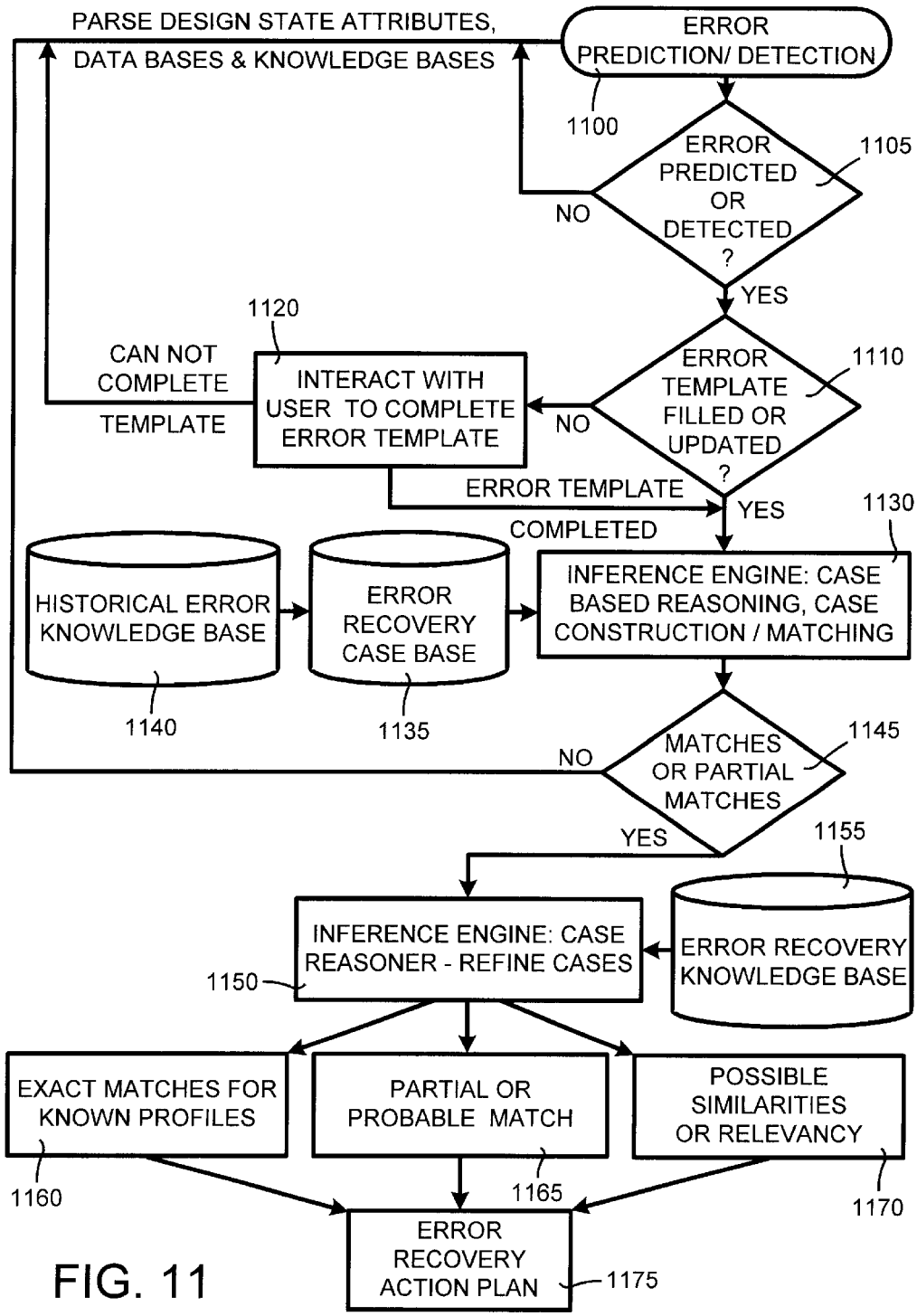
FIG. 11 is an exemplary architectural flow diagram illustrating an inference engine used for design error recovery in accordance with the present invention.

As illustrated in the architectural flow diagram of FIG. 11, following initiation of the error prediction and detection systems described above (Box 1100), once a design error has been predicted or detected (Box 1105), an error profile is generated which is as complete and detailed as possible given the information in the various databases and knowledge bases described above. Error profiles generated for the purposes of error recovery preferably include data such as, for example, a description of the error, known error symptoms, tasks or tools causing or otherwise related to the error, tasks or tools used to detect the error, the impact or side effects of the error, design units and functions within the overall design which contain the error, design units and functions affected by the error, and related errors preceding or succeeding the predicted or detected error.

After the error profile has been produced, the error profile is used to generate an error-case template (Box 1110). The error-case template preferably contains information such as, for example, a set of attributes defining the error, a value or other data describing each attribute, comments for each attribute, and a ranking or score for identifying the importance of the attribute. Because the knowledge bases and databases described above may not always contain sufficient information to satisfactorily complete the error-case-template, the error recovery system according to the present invention preferably interacts with the user if necessary (Box 1120), through a series of interactive questions and prompts, to complete the error-case template. If the user is unable to assist in sufficiently completing a case-error template such that the inference engine has sufficient data for case-based reasoning in inferring and identifying solutions to predicted or detected errors, the system of the present invention preferably returns to Box 1100 to gather more information about the predicted or detected errors under investigation, or to continue with new predicted or detected errors.

One example of an error-case template generated in accordance with the present invention is illustrated in TABLE 1, which illustrates exemplary attributes, which in some cases have exemplary values or other data describing the attributes, comments and ranking. The attribute ranking is preferably a degree of importance associated with an attribute in uniquely identifying a case.

TABLE 1

Exemplary Error-Case Template

| Attribute Name | Attribute Value | Comments | Rank |
| --- | --- | --- | --- |
| Error Title | LWARX/SNOOP collision | | 1 |
| Error Description | LWARX/SNOOP collision hangs processor | | 16 |
| Error Type | Reservation Address | LWARX/ STWCX, Snooping | 8 |
| Impact | Processor will hang | | 9 |

TABLE 1-continued

Exemplary Error-Case Template

| Attribute Name | Attribute Value | Comments | Rank |
|---|---|---|---|
| Workaround | Insert a SYNC before LWARX | | 10 |
| Tools Causing Error | | | 3 |
| Tools Discovering Error | Genie, AVP | Error was discovered during MP verification | 4 |
| Tasks Causing Error | MSS logic design | | 5 |
| Tasks Discovering Error | MP verification | | 6 |
| How Error Verified | Verification | MP Verification of MSS | 11 |
| System Unit Containing Error | MSS | | 12 |
| Functions Impacted by Error | LWARX, STWEX, SNOOP | Reservation | 13 |
| How To Fix Error | Architecture, Logic | | 14 |
| Cause of Missing Error in Initial Design | Rare situation and small window of opportunity | | 15 |
| Other Projects or Designs Impacted | | First design with this error | 7 |
| How Fix Verified | Test case updated and simulated | | 2 |

Once the error-case template has been filled out sufficiently, either automatically, or with assistance from the user (Box 1120), the inference engine (Box 1130) preferably uses case-based inferential reasoning to identify relevant cases from historical designs in a repository of historical error cases in an error recovery case knowledge base (Box 1135) which is preferably dynamically derived and constructed from the historical design knowledge base (Box 1140). If a relevant, similar, near exact, or exact match is not identified, the system of the present invention preferably returns to Box 1100 to gather more information about the predicted or detected errors under investigation, or to continue with new predicted or detected errors. However, if a match is identified, the inference engine preferably further refines the error-case template (Box 1150) using information from the error case recovery knowledge base (Box 1155).

If an exact match is identified or inferred (Box 1160), the user is preferably alerted as described above, and a plan of action for addressing the error (Box 1175) is preferably automatically generated using information from the error-case template and the various knowledge bases and databases described above. Such a plan of action preferably includes information such as, for example, how to verify the error, how to either fix or work around the error, how to verify the fix or workaround, possible side effects of either or both the error and the identified fix or workaround. If there is no known, proven, or verifiable fix or workaround for the predicted or detected error, a plan of action is preferably generated, that contains information such as, for example, all known pertinent information from the various knowledge bases and databases described above, a list of projects or designs impacted by the error, how the error was discovered or verified, individuals such as designers or engineers that worked on the functional areas involved in the error or that may have reported the error in historical designs, and what fixes or workarounds were attempted with the error in historical designs.

Where a partial match is inferred or identified (Box 1165), such as where some, but not all, of the attributes of an error case profile under study match one or more historical error cases, a case profile is preferably automatically generated for each match. The inference engine preferably uses inferential reasoning to generate as complete an error case profile as possible given the information available in the various knowledge bases and databases described above. One example of the error case profile created for each partial match identified in accordance with the present invention is illustrated in TABLE 2, which shows exemplary attributes, which in some cases have exemplary values or other data describing the attributes, comments and ranking, as well as an attribute match confidence factor, which is simply the probability that the attribute matches a corresponding attribute of an existing case from a historical design.

TABLE 2

Partial Match Error Case Profile

| Attribute Name | Attribute Value | Comments | Rank | Confidence Value (%) |
|---|---|---|---|---|
| Error Title | | | 1 | 0 |
| Error Description | | | 10 | 75 |
| Error Type | | | 3 | 50 |
| Impact | | | 2 | 80 |
| Workaround | | | 11 | 0 |
| Tools Causing Error | | | 4 | 90 |
| Tools Discovering Error | | | 5 | 0 |
| Tasks Causing Error | | | 6 | 80 |
| Tasks Discovering Error | | | 7 | 0 |
| How Error Verified | | | 8 | 100 |
| System Unit Containing Error | | | 9 | 100 |
| Functions Impacted by Error | | | 12 | 20 |
| How To Fix Error | | | 13 | 30 |
| Cause of Missing Error in Initial Design | | | 14 | 40 |
| Other Projects or Designs Impacted | | | 15 | 0 |
| How Fix Verified | | | 16 | 0 |
| Case Relevancy Coefficient | | 1.3 | | |

Once the error profiles for the partial matches have been generated, the user is preferably alerted as described above, and each of the error case profiles is preferably presented to the user. The inference engine then initiates an interactive computer environment such that a system according to the present invention preferably presents the user with a series of questions, tasks to perform and data to verify in order to complete any incomplete attributes, refine partially matched attributes, and evaluate any unmatched attributes of the error in the present design. Any new information added to the error case profile as a result of user interaction with the questions, tasks, and data verification presented by the inference engine is preferably used to upgrade the inferred and identified error case profiles associated with the predicted or detected error under study.

Further, a case-relevancy coefficient is preferably calculated for each inferred or identified error case profile. Error case profiles are then preferably sorted in order of relevancy and presented to the user with the most relevant error case profile presented first. One example of an equation useful for calculating the case-relevancy coefficient is illustrated in Equation 7 as follows:

$$\text{Case Relevancy Coefficient} = \sum_{n=1}^{N} \frac{1}{(\text{Attribute Rank})} \times \text{Attribute Match Confidence Factor}$$

Once the error case profiles are sorted in order of relevancy as described above, the user is preferably alerted as described above, and plans of action (Box 1175) for addressing the error are preferably automatically generated for each error case profile, using information from the error case profile and the various knowledge bases and databases described above. Such a plan of action preferably includes information such as, for example, how to verify the error, how to either fix or work around the error, how to verify the fix or workaround, possible side effects of either or both the error and the identified fix or workaround. User feedback and input, as described above may then be used to further refine the error profile cases as described above.

When similar or relevant matches (Box 1170) are inferred or identified, the inference engine then preferably identifies error cases caused in similar preceding or succeeding design tasks, error cases caused by similar preceding or succeeding design tasks, and error cases caused in functional units feeding or being fed by the functional unit having the predicted or detected error. The inference engine preferably alerts the user as described above, and presents this data to the user via the user interface for further investigation and refinement as described above. Once the user has investigated and updated or refined the data, the inference engine (Box 1150) again preferably makes use of the updated or refined data to determine whether there is an exact, partial, similar or relevant match to historical data as described above.

Figure 12:
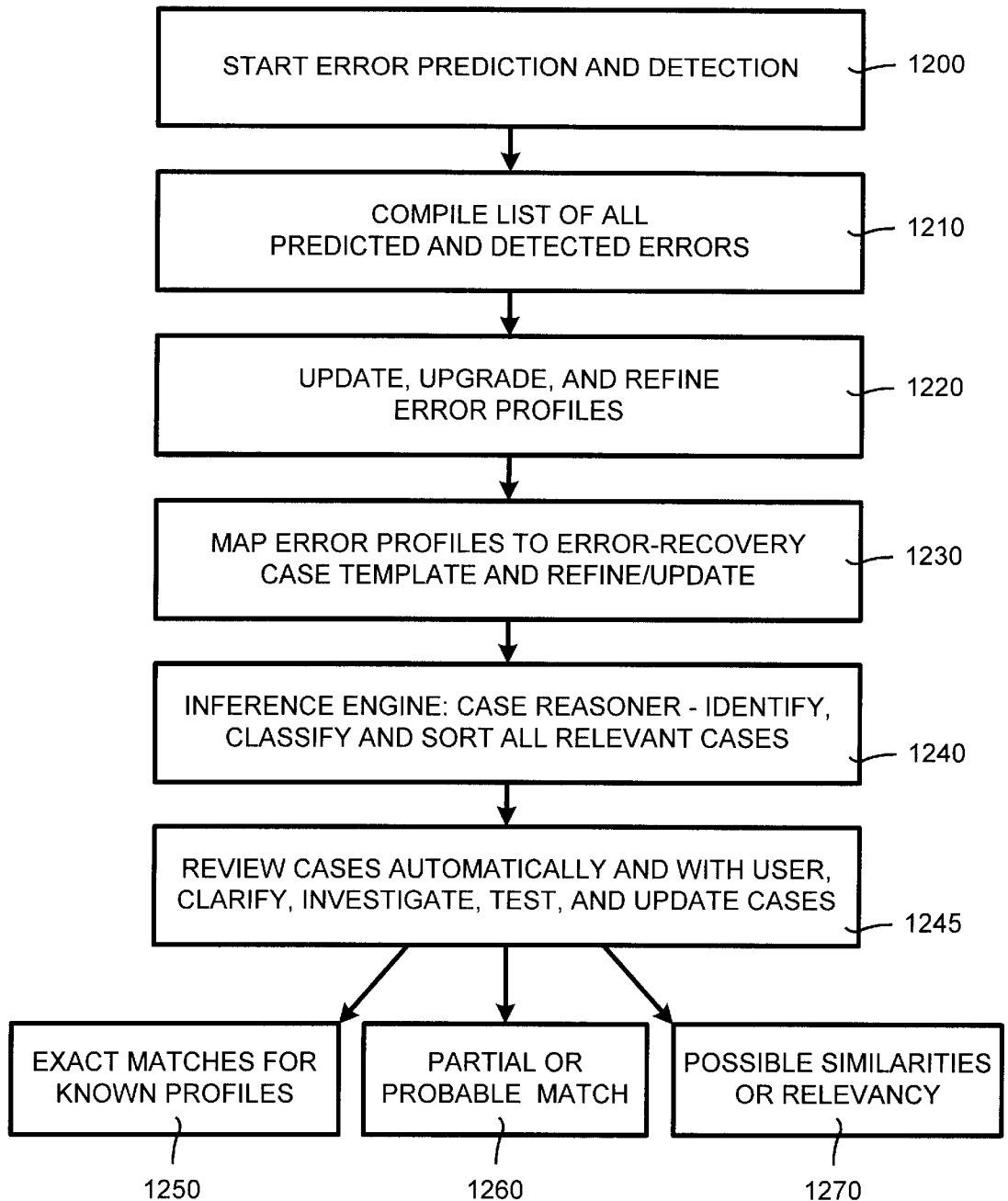
FIG. 12 is an exemplary functional flow diagram illustrating an inference engine used for design error recovery in accordance with the present invention.

The architectural flow diagram of FIG. 11 may be further summarized by the design error recovery process flow chart of FIG. 12. FIG. 12 shows that following prediction or detection of an error (Box 1200), the system of the present invention preferably compiles a list of all predicted or detected error, and generates error profiles for the errors (Box 1210). These error profiles are then preferably refined (Box 1220) either automatically or with user interaction as described above. The error profiles are then mapped to error-case templates or error case profiles and again further refined as described above (Box 1230).

The inference engine then preferably uses inferential case-based reasoning, as described above, to identify, classify, and sort all relevant cases (Box 1240). Next, the cases are preferably reviewed, clarified, investigated, tested and updated as described above (Box 1245). The user is then preferably alerted and plans of action and scenarios for further investigation are generated as described for cases of exact match to historical error data (Box 1250), partial or probable matches to historical error data (1260), and relevant or similar matches to historical error data (Box 1270).

The foregoing description of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for identifying design errors in an integrated circuit design comprising:
   developing probabilistic relationships between current integrated circuit design information and historical integrated circuit design information; and
   predicting at least one design error of the integrated circuit design using the probabilistic relationships between the current integrated circuit design information and the historical integrated circuit design information.

2. The method of claim 1 wherein developing the probabilistic relationships comprises performing an inferential comparison of the current integrated circuit design information and the historical integrated circuit design information.

3. The method of claim 1 wherein the probabilistic relationships are used to infer probabilistic matches between design state information associated with design errors in historical integrated circuit designs to design state information of the current integrated circuit design.

4. The method of claim 1 wherein a probabilistic model of the current integrated circuit design information is generated using the probabilistic relationships.

5. The method of claim 1 wherein an inference engine infers at least one abnormal design condition in the current integrated circuit design using the probabilistic relationships.

6. The method of claim 5 wherein the inference engine uses the at least one abnormal design condition to predict the occurrence of the at least one design error in the current integrated circuit design.

7. The method of claim 1 wherein an inference engine infers at least one probabilistic relationship between the at least one predicted design error in the current integrated circuit design and information associated with at least one historical design error in the historical integrated circuit design information.

8. The method of claim 7 wherein the at least one probabilistic relationship between the at least one predicted design error in the current integrated circuit design and information associated with the at least one historical design error is presented in an interactive computer program environment.

9. The method of claim 7 wherein the inference engine uses the at least one probabilistic relationship to infer the occurrence of the at least one design error including known design errors, and new design errors.

10. The method of claim 1 wherein an alert is automatically generated when the at least one design error is predicted.

11. The method of claim 1 wherein design information associated with the at least one predicted design error is presented in an interactive computer program environment.

12. The method of claim 1 wherein the current integrated circuit design information includes any of:
   current information and data delimiting current design attributes;
   design verification and simulation test results for the current design;
   current design states;
   tools used to develop the current design;
   tasks completed in the current design;
   conditions existing in the current design;
   errors already predicted for the current design; and
   errors already detected for the current design.

13. The method of claim 1 wherein the historical integrated circuit design information includes any of:
   errors that have occurred in previous designs;
   design tasks associated with the errors that have occurred in previous designs;
   design tools associated with the errors that have occurred in previous designs;

design conditions associated with the errors that have occurred in previous designs; and solutions used to address the errors that have occurred in previous designs.

14. A system for determining a current design state of an integrated circuit design, comprising:

an inference engine for automatically inferring at least one conditional probability of the occurrence of at least one design error in the circuit design;

a probabilistic model for automatically determining conditional relationships between attributes of the current design and the at least one conditional probability of the occurrence of the at least one design error; and a dynamic data matrix comprising current design information, the conditional relationships between attributes of the current design, and the at least one conditional probability of the occurrence of the at least one design error.

15. The system of claim 14 wherein the inference engine automatically compares current design information to historical design information compiled from prior integrated circuit designs.

16. The system of claim 15 wherein the inference engine uses inferential reasoning to compare the current design information to the historical design information to identify probabilistic relationships between the current design information and the historical design information.

17. The system of claim 16 wherein the inference engine predicts the occurrence of the at least one design error using the probabilistic relationships between the current design information and the historical design information.

18. The system of claim 14 wherein the probabilistic model is automatically generated using data from the dynamic data matrix.

19. The system of claim 14 wherein the dynamic matrix further comprises tasks, conditions, predicted design errors, and conditional probabilities associated with interrelationships between the tasks, conditions, and predicted design errors.

20. The system of claim 14 wherein the dynamic matrix is automatically presented in an interactive computer program environment.

21. The system of claim 14 wherein the inference engine is automatically presented in an interactive computer program environment.

22. A computer-readable medium having computer-executable modules for identifying design errors in an integrated circuit comprising:

an inference processor that automatically infers at least one conditional probability for predicting an occurrence of at least one design error;

a probabilistic model processor for automatically determining conditional relationships between the conditional probabilities and predicted design errors of the current design, and design attributes associated with the conditional probabilities and the predicted design errors; and a data processor for dynamically generating and displaying current design information, the conditional relationships between attributes, and the conditional probabilities and predicted design errors of the current design in an interactive computer program environment.

23. The computer-readable medium of claim 22 wherein the inference processor automatically uses inferential reasoning to compare current design information to historical design information compiled from prior designs of integrated circuits.

24. The computer-readable medium of claim 23 wherein the inference processor identifies conditional probabilistic relationships between the current design information and the historical design information.

25. The computer-readable medium of claim 23 wherein the current design information is presented in an interactive computer program environment.

26. The computer-readable medium of claim 23 wherein the historical design information is presented in an interactive computer program environment.

27. The computer-readable medium of claim 22 wherein the probabilistic model processor is initialized using data from the data processor.

28. The computer-readable medium of claim 22 wherein an alert processor automatically generates an alert when the inference processor predicts the existence of the at least one design error.

29. The computer-readable medium of claim 22 wherein the inference processor is presented in an interactive computer program environment.

* * * * *